US010621091B2

(12) United States Patent
Mondello et al.

(10) Patent No.: US 10,621,091 B2
(45) Date of Patent: Apr. 14, 2020

(54) APPARATUSES AND METHODS TO PERFORM CONTINUOUS READ OPERATIONS

(71) Applicant: Micron Technology, Inc., Boise, ID (US)

(72) Inventors: Antonino Mondello, Messina (IT); Francesco Tomaiuolo, Acireale (IT); Salvatore Giove, Giarre (IT); Pierluca Guarino, Rosolini (IT); Fabio Indelicato, Aci Sant'Antonio (IT); Marco Ruta, San Gregorio di Catania (IT); Maria Luisa Gambina, Catania (IT); Giovanni Nunzio Maria Avenia, Delia (IT); Carmela Maria Calafato, Pedara (IT)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 15/971,653

(22) Filed: May 4, 2018

(65) Prior Publication Data

US 2019/0340125 A1 Nov. 7, 2019

(51) Int. Cl.
| G06F 11/00 | (2006.01) |
| G06F 12/0811 | (2016.01) |
| G11C 29/52 | (2006.01) |
| G06F 11/10 | (2006.01) |

(52) U.S. Cl.
CPC ...... *G06F 12/0811* (2013.01); *G06F 11/1068* (2013.01); *G11C 29/52* (2013.01); *G06F 2212/1016* (2013.01)

(58) Field of Classification Search
None
See application file for complete search history.

(56) References Cited

U.S. PATENT DOCUMENTS

| 8,667,368 B2 | 3/2014 | Gupta et al. |
| 9,442,798 B2 | 9/2016 | Michael et al. |
| (Continued) | | |

OTHER PUBLICATIONS

Winbond, "3V 1G Bit Serial SLC NAND Flash Memory with Dual/Quad SPI Buffer Read & Continuous Read", Revision G, published Mar. 21, 2016, (68 pgs.), retrieved from: http://www.winbond.com/resource-files/w25n01gv%20revg%20032116.pdf.

*Primary Examiner* — Mujtaba M Chaudry
(74) *Attorney, Agent, or Firm* — Brooks, Cameron & Huebsch, PLLC

(57) ABSTRACT

Apparatuses, systems, and methods to perform continuous read operations are described. A system configured to perform such continuous read operations enables improved access to and processing of data for performance of associated functions. For instance, one apparatus described herein includes a memory device having an array that includes a plurality of pages of memory cells. The memory device includes a page buffer coupled to the array and a continuous read buffer. The continuous read buffer includes a first cache to receive a first segment of data values and a second cache to receive a second segment of the data values from the page buffer. The memory device is configured to perform a continuous read operation on the first and second segments of data from the first cache and the second cache of the continuous read buffer.

28 Claims, 7 Drawing Sheets

(56) References Cited

U.S. PATENT DOCUMENTS

| | | | |
|---|---|---|---|
| 2009/0125790 A1* | 5/2009 | Iyer | G06F 11/1068 714/773 |
| 2012/0173953 A1* | 7/2012 | Flynn | G06F 11/1004 714/758 |
| 2012/0278664 A1* | 11/2012 | Kazui | G06F 12/0246 714/48 |
| 2013/0297987 A1* | 11/2013 | Gupta | G06F 11/1064 714/773 |
| 2014/0269065 A1* | 9/2014 | Jigour | G11C 29/04 365/185.09 |
| 2015/0019918 A1* | 1/2015 | Li | G06F 11/108 714/54 |
| 2015/0113355 A1* | 4/2015 | Kang | G06F 11/1048 714/764 |
| 2015/0378808 A1* | 12/2015 | Kumar | G09C 1/00 714/799 |
| 2016/0034345 A1* | 2/2016 | Royer, Jr. | G06F 11/1048 714/766 |
| 2016/0034352 A1* | 2/2016 | Michael | G06F 11/1072 714/773 |
| 2016/0140007 A1* | 5/2016 | Cho | G06F 11/2205 714/42 |
| 2017/0110196 A1 | 4/2017 | Jigour et al. | |

\* cited by examiner

APPARATUSES AND METHODS TO PERFORM CONTINUOUS READ OPERATIONS

TECHNICAL FIELD

The present disclosure relates generally to memory devices, and more particularly, to apparatuses and methods to perform continuous read operations.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), static random access memory (SRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system, such as a solid state drive (SSD). An SSD can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as an SSD may have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

DETAILED DESCRIPTION

Figure 1:
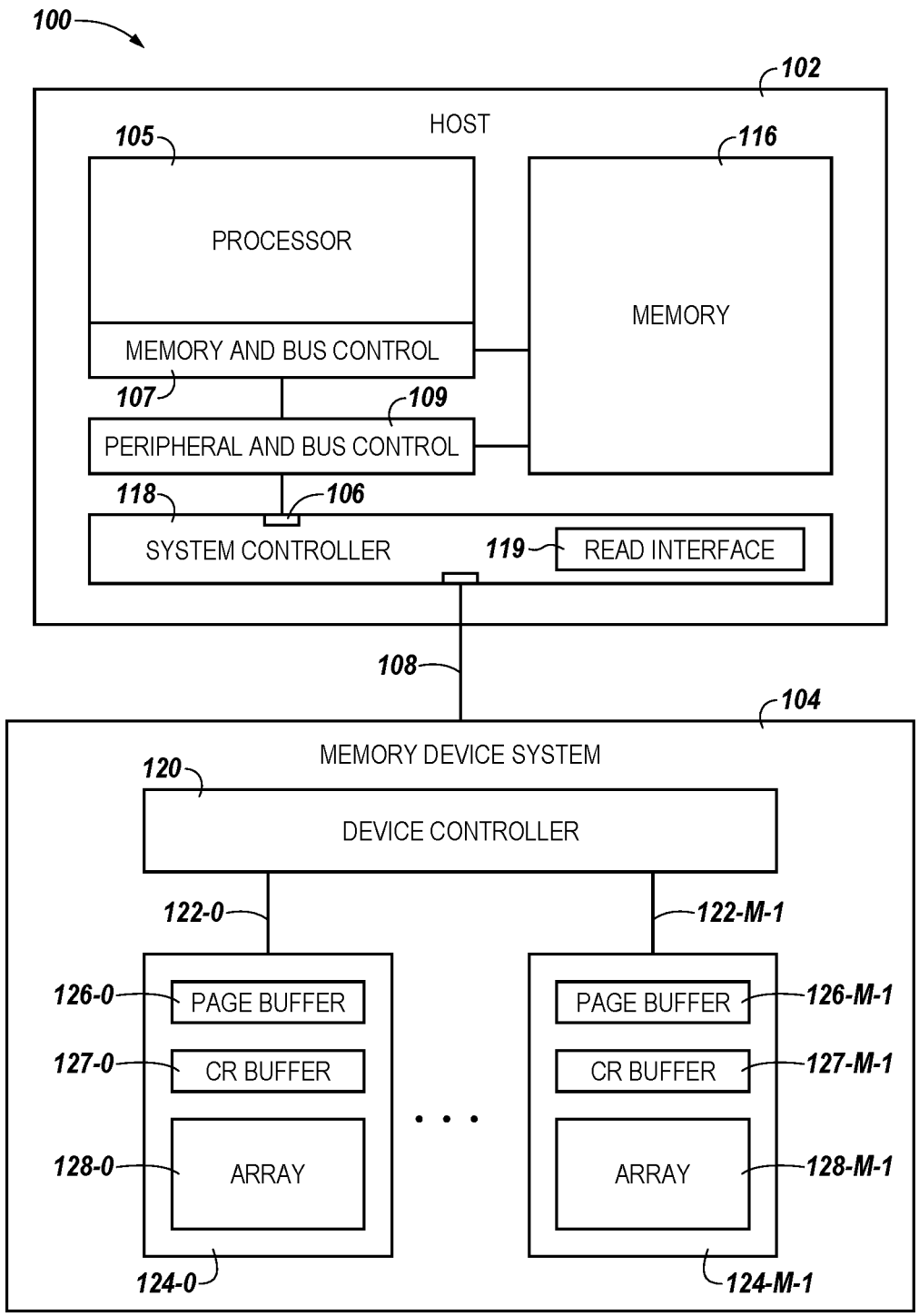
FIG. 1 is a block diagram of an apparatus in the form of a computing system to perform continuous read operations in accordance a number of embodiments of the present disclosure.

Apparatuses, systems, and methods to perform continuous read operations are described. For instance, one apparatus described herein includes a memory device having an array that includes a plurality of pages of memory cells. The memory device includes a page buffer selectably coupled to the array, where the page buffer includes a plurality of caches each configured to store a plurality of data values that corresponds to a number of the memory cells of a page. The memory device also includes a continuous read (CR) buffer that includes a first cache configured to receive a first segment of the data values from the page buffer and a second cache configured to receive a second segment of the data values from the page buffer. The memory device is configured to perform a continuous read operation on the first and second segments of data (e.g., a continuous plurality of segments) from the first cache and the second cache of the CR buffer.

A continuous read operation, as described herein, is intended to mean that a read operation may be initiated, responsive to a single command (e.g., from a host), on data values stored by a plurality of memory cells (e.g., in a single page or a plurality of pages, as described herein) and that a number of data values corresponding to a single page is moved (e.g., read, transferred and/or copied) to a page buffer. The data values for the page may be moved (e.g., read, transferred and/or copied) from the page buffer as subsets (e.g., segments) alternately to the first cache and the second cache of the CR buffer (e.g., interleaving the segments). Being moved alternately is intended to mean that data values corresponding to a first segment of a page, or a first segment of plurality of pages, are moved to or from the first cache of the CR buffer, data values corresponding to a sequentially second segment of the page or plurality of pages are moved to or from the second cache, and data values corresponding to a sequentially third segment of the page or plurality of pages are moved once again to or from the first cache, etc., by alternating between the first and second caches. Responsive to the single command (e.g., from the host), the continuous read operation may be performed by alternately moving the data values of the sequential series of segments continuously (e.g., uninterruptedly) until a read operation on all the segments of the page or plurality of pages is completed (e.g., by the sequential data values being moved to an input/output (I/O) line selectably coupled to the host).

Embodiments of the present disclosure may provide various benefits. A system configured to perform such continuous read operations may enable improved access to and processing of data for performance of associated functions. For example, utilization of an error correction code (ECC) functionality, as described herein, during the continuous read operations for performance of functions (e.g., including automated functions) may contribute to prevention of damage to a product, reliable operation, and/or personnel safety, among other potential benefits.

A processing resource, in combination with a memory resource, may be operated at a high speed (e.g., at a bandwidth of 10 megabits per second (MB/s) or greater) to enable performance of some functions. Faster processing of data may contribute to the performance by prevention of damage to a product, reliable operation, and/or personnel safety, etc. Such functions may include autonomous functions, which may, for example, use machine learning and/or artificial intelligence to perceive an environment and adjust operations accordingly to improve probability of yielding an intended outcome of a particular functionality (e.g., without human interaction and/or supervision). Faster performance of the operations contributing to such automated functionalities may enable (e.g., be critical for) prevention of damage to and/or reliability of a product including such automated functionalities (e.g., real-time control of automated medical machinery, traffic control systems, and autonomous vehicles, such as automobiles, trucks, trains, airplanes, rockets, space stations, etc., among many other possibilities) and/or safety of transport of an associated object (e.g., a patient, an operator, and a passenger, etc., among many other possibilities).

As described herein, improved performance of various functions may be based on improved access to and/or processing of data by, for example, increase of throughput and/or reduction of latency (e.g., to approach a theoretical bandwidth of a memory device). For example, in a number of embodiments, performing the read operation continuously on segments of the page, or plurality of pages, after the segments are moved from the page buffer to the first cache and the second cache, as described herein, may increase the throughput relative to data values of a plurality of pages being stored as complete pages by the page buffer and sequentially coupled as complete pages to the I/O line (e.g., for a read operation in which the read data is moved via the I/O line to a host). Performing the read operation continuously, as described herein, also may decrease the latency relative to receiving separate commands (e.g., versus the single command) to initiate a read of the plurality of data values for each page of the plurality of pages and/or receiving separate commands (e.g., versus the single command) to initiate output (e.g., via the I/O line) of the read plurality of data values for each page of the plurality of pages.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit corresponds to the figure number and the remaining digits identify an element or component in the drawing. Similar elements or components between different figures may be identified by the use of similar digits. For example, 127 may reference element "27" in FIG. 1, and a similar element may be referenced as 627 in FIG. 6. Multiple analogous elements, particularly with respect to the figures, may be referenced with a reference number followed by a hyphen and another number or a letter. For example, reference numbers with hyphenated digits and/or designators such as "M", "N", "X", "Y", etc., (e.g., 127-0 through 127-M−1 in FIG. 1) indicate that a plurality of the particular feature so designated may be included. As such, 127-0 may reference element 27-0 in FIG. 1 and 127-M−1 may reference element 27-M−1, which may be analogous to element 27-0. Such analogous elements may be generally referenced without the hyphen and an extra numeral or letter. For example, in some embodiments, all of the plurality of the particular elements 127-0 through 127-M−1 may be generally referenced as 127.

It is also to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "data" and "data values" are used interchangeably herein and may have the same meaning, as appropriate to the context (e.g., one or more data units or "bits").

The terms "coupled" and "coupling" mean to be connected physically for access to and/or for movement (transmission) of instructions (e.g., commands, control signals, address information (signals), etc.) and data, as appropriate to the context. Accordingly, "coupled to" is intended to refer to such a connection between components, which may be an indirect communicative connection or a direct communicative connection (e.g., without intervening components), whether wired or wireless, including connections such as, electrical, optical, magnetic, etc. Being "selectably coupled" is intended to mean that a first component may be optionally connected to a second component (e.g., a component that is different from the first component) and/or that the first component may be optionally coupled to one or more of a plurality of other components (e.g., the second component, a third component, and/or a fourth component, etc.) by being selected from a number of options (e.g., based upon execution of instructions from a host and/or a controller, as described herein).

FIG. 1 is a block diagram of an apparatus in the form of a computing system 100 to perform continuous read operations in accordance a number of embodiments of the present disclosure. As used herein, a host (e.g., 102), a memory device system (e.g., 104), a host controller (e.g., system controller 118), or a memory device controller (e.g., device controller 120) also might each be separately considered an "apparatus".

Computing system 100 includes the memory device system 104 (e.g., an SSD) coupled to the host 102 through an input/output (I/O) interface 108. The memory device system 104 may be a solid state storage appliance implemented using a number of SSDs, for example. The computing system 100 may include a controller internal to the memory device system 104 (e.g., device controller 120), in addition to the controller internal to the host (e.g., system controller 118). The device controller 120 may be coupled to a number of memory resources in the memory device system 104 via a number of suitable memory interfaces (e.g., buses 122-0, . . . , 122-M−1). The memory resources may, in a number of embodiments, include a number of SSD memory resources, such as memory devices 124-0, . . . , 124-M−1, which may be or may include a number of volatile memory devices (e.g., DRAM, SRAM, etc.) and/or non-volatile memory devices (e.g., NAND, NOR, etc.) for the page buffers 126-0, . . . , 126-M−1, continuous read (CR) buffers 127-0, . . . , 127-M−1, and/or the arrays 128-0, . . . , 128-M−1.

For example, each of the page buffers 126-0, . . . , 126-M−1 may include a primary data cache (abbreviated herein as PDC or primary cache) 232 and a secondary data cache (abbreviated herein as SDC or secondary cache) 233 of the respective page buffer 226 (e.g., as shown and described in connection with FIG. 2), each of which may, in a number of embodiments, be volatile or non-volatile RAM (e.g., DRAM, SRAM, PCRAM, and/or MRAM, among others). Each PDC 232 and SDC 233 of a respective page buffer 126 may include a number of memory cells for storage of a number of data values that corresponds to a page of memory in an array 128 to which the page buffer 126 is selectably coupled (e.g., as shown and described in connection with FIG. 3). Each of the CR buffers 127-0, . . . , 127-M−1 may include a first continuous read data cache (abbreviated herein as CRDC 0 or first cache) 237-0 and a second continuous read data cache (abbreviated herein as CRDC 1 or second cache) 237-1 (e.g., as shown and described in connection with FIG. 2), each of which also may, in a number of embodiments, be volatile or non-volatile RAM (e.g., DRAM, SRAM, PCRAM, RRAM, and/or MRAM, among others). Each CRDC 237 of a respective CR buffer 127 may include a number of memory cells for storage of a number of data values that corresponds to a segment of a page of memory in the array 128 to which the CR buffer 127 is selectably coupled via the page buffer 126 (e.g., as shown and described in connection with FIG. 3). A buffer and/or a cache may, in a number of embodiments, be considered to be a "latch," as appropriate to the context.

Each of the arrays 128-0, . . . , 128-M−1 of memory cells of the respective memory devices 124-0, . . . , 124-M−1 may include a plurality of pages (e.g., rows or lines of memory cells). The memory cells in the arrays 128 may be formed, in a number of embodiments, in a non-volatile configuration. Examples of such non-volatile configurations may include NAND flash memory (in serial and/or parallel configurations), NOR flash memory, ROM, EEPROM, EPROM, PCRAM, RRAM, and/or MRAM, among others.

Example hosts 102 may include laptop computers, personal computers, digital cameras, digital recording and playback devices, mobile telephones, PDAs (personal digital assistants), memory card readers, interface hubs, and/or Internet of Things (IOT) enabled devices, among other host systems. A host interface 106 may include a serial advanced technology attachment (SATA), peripheral component interconnect express (PCIe), or a universal serial bus (USB), among other connectors and interfaces for interaction with host components. The host interface 106, in combination with the I/O interface 108 of the memory device system 104, may provide an interface for passing control, address, data, and other signals between the host 102 and the memory device system 104.

Host 102 may include a number of processors 105 (e.g., serial processors, parallel processors, co-processors, a central processing unit (CPU), etc.) coupled to a memory and bus control 107. The processor 105 may be a number of microprocessors, or some other type of controlling circuitry, such as a number of application-specific integrated circuits (ASICs), for example. Other components of the computing system 100 also may have processors. The memory and bus control 107 may have memory 116 and/or other components coupled thereto. In this example, memory and bus control 107 is coupled to a host memory 116, which in a number of embodiments may include volatile memory (e.g., DRAM) and/or non-volatile memory (e.g., NAND), among other types of memory. In this example, a peripheral and bus control 109 may be coupled (e.g., via the host interface 106) to the host memory 116, a flash drive (not shown) (e.g., via a universal serial bus (USB) interface), a non-volatile memory host control interface (NVMHCI) flash memory (not shown), and/or the memory device system 104 (e.g., via the system controller 118 and/or the I/O interface 108). The memory device system 104 may be used in addition to, or in lieu of, a hard disk drive (HDD) in a number of different computing systems. The computing system 100 illustrated in FIG. 1 is one example of such a system; however, embodiments of the present disclosure are not limited to the configuration shown in FIG. 1.

As one example, the memory device system 104 may be a SSD. The memory device system 104 may include the device controller 120 (e.g., memory control circuitry, firmware, and/or software) coupled to a number of memory resources (e.g., memory devices 124-0, . . . , 124-M−1) via a bus (e.g., buses 122-0, . . . , 122-M−1). The system controller 118 includes the host interface 106 for communication with the host 102 and the I/O interface 108 may communicate with the memory devices 124-0, . . . , 124-M−1 via the buses 122-0, . . . , 122-M−1. Various buses also may send and/or receive various signals (e.g., data signals, control signals, and/or address signals, among others) between the memory device 124 and/or the device controller 120 thereof and the system controller 118.

The system controller 118 may include a read interface 119 that is configured to issue (e.g., send) a plurality of read commands to the memory devices 124. The read interface 119 may, in a number of embodiments, be associated with (e.g., formed as part of) the system controller 118. Responsive to receiving a particular read command selected from a plurality of read commands, the memory devices 124 are each configured to perform a particular read operation, as described herein.

Figure 2:
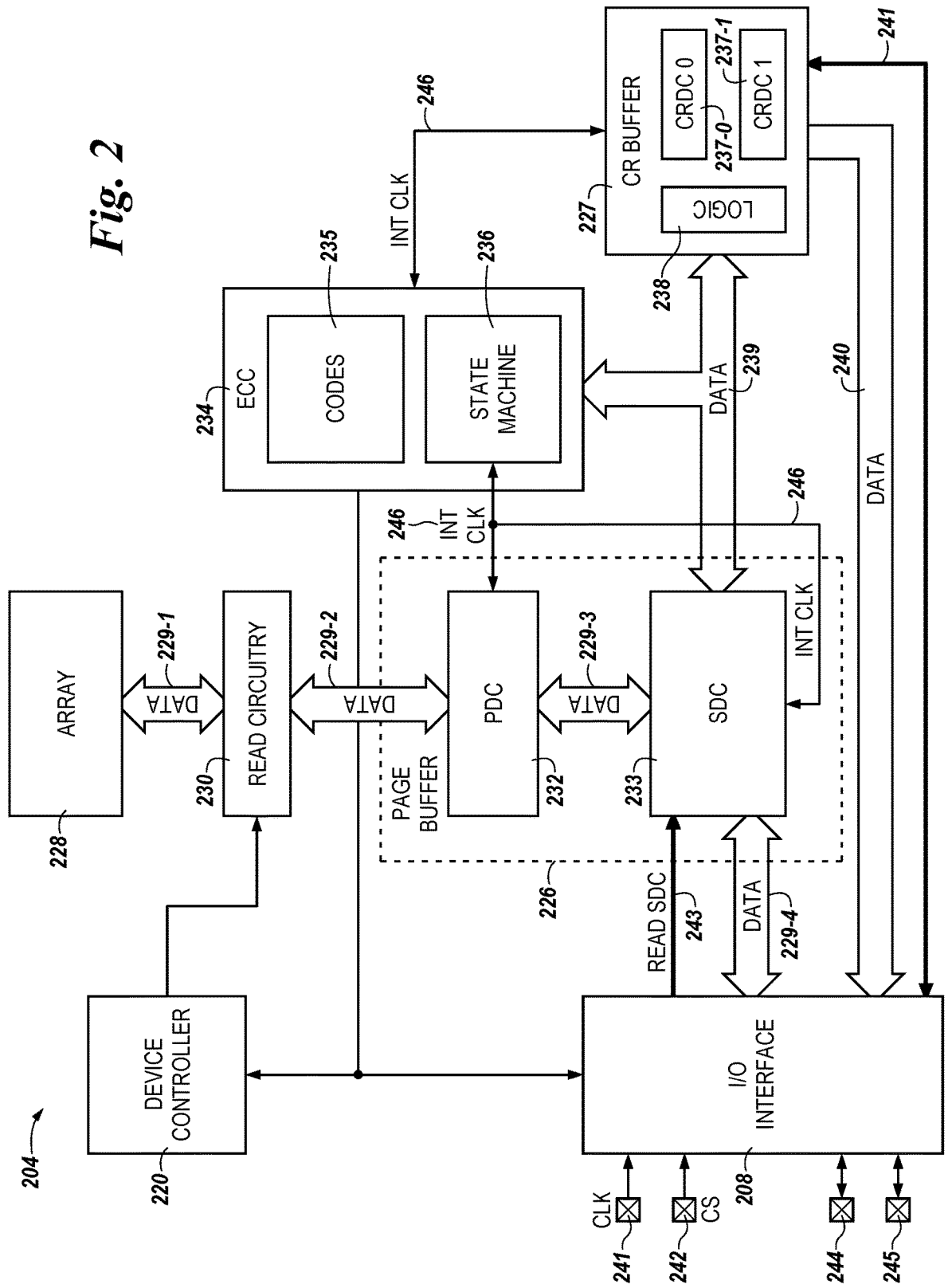
FIG. 2 is a block diagram of an apparatus in the form of a memory device system configured to perform continuous read operations in accordance with a number of embodiments of the present disclosure.

Although the examples illustrated in FIGS. 1 and 2 include a single I/O interface 108 serving as a bus, the memory device system 104 may include a separate data bus (DQ bus), control bus, and/or address bus for each memory device 124. Such buses may have various types of bus structures including, but not limited to, bus structures related to Open NAND Flash Interface (ONFI), Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and/or Small Computer Systems Interface (SCSI), among others. The system controller 118 may be configured to support various data interface types associated with the memory device system 104 (e.g., NV-DDR, NV-DDR2, NV-DDR3, among others).

The system controller 118 may include, in a number of embodiments, a translation component (not shown), which may be a flash translation layer (FTL), for example, associated with logical to physical address translation between the host 102 and memory device system 104. For example, the translation component may include a mapping table of logical block addresses (LBAs) to physical block addresses (PBAs). The pages, blocks, planes, and/or associated word lines described herein also may be mapped from logical addresses to physical addresses (e.g., by the device controller 120). Although not shown in FIG. 1, device controller 120 also may include various other components implemented in hardware, firmware, and/or software and associated with management of memory device system 104.

Each of the number of memory devices 124-0, . . . , 124-M-1 may include, in a number of embodiments, the page buffer 126 (e.g., 126-1, . . . , 126-M-1), the CR buffer 127 (e.g., 127-1, . . . , 127-M-1), and an array of memory cells 128 (e.g., 128-0, . . . , 128-M-1). In a number of embodiments, each of the page buffers 126-0, . . . , 126-M-1 may be an internal buffer of a respective memory device 124-0, . . . , 124-M-1 (e.g., a page buffer 126 may be located internal to a core region the memory device 124 along with the array 128, as described further in connection with FIG. 6). In contrast, in a number of embodiments, each of the CR buffers 127 (e.g., 127-1, . . . , 127-M-1) may be peripheral buffer of a respective memory device 124-0, . . . , 124-M-1 (e.g., a CR buffer 127 may be located peripheral to the core region the memory device 124, as described further in connection with FIG. 6).

Data movement, as used herein, is an inclusive term that includes, for instance, reading, writing, copying, transferring, and/or transporting data values from a source location to a destination location. Data for a segment of a page may, for example, be moved from a page buffer (based on an access and/or read of such data) to a CR buffer (e.g., a first or second cache thereof) via a dedicated I/O line shared, for example, by the page buffer (e.g., a secondary data cache thereof) and the CR buffer, as described herein. Copying the data values may indicate that the stored (cached) data values are copied and moved to another cache and/or a host via a shared I/O line and that the original stored data values may remain unchanged (e.g., in volatile and/or non-volatile memory). Transferring the data values may indicate that the stored (cached) data values are copied and moved to via the shared I/O line and that at least one of the original stored data values in may be changed (e.g., by volatile DRAM being erased responsive to performance of a read operation and/or by non-volatile MRAM being overwritten responsive to a subsequent write operation, among other possible configurations of volatile and/or non-volatile memory). Transporting the data values may be used to indicate the process by which the copied and/or transferred data values are moved (e.g., by the data values being placed on the shared I/O line from the source location and transported to the destination location).

To interleave data, as used herein, is intended to mean to read, store, move, and/or mix (e.g., merge) two or more separate sequences of data that originated as a continuous sequence of data (e.g., segments of a page) by alternating between the two or more separate sequences. As such, memory and/or processing of a memory device may be divided between processing (e.g., access, read, write, and/or movement operations, etc.) by interleaving processing of the separate sequences of the segments. With interleaved memory, memory addresses may be alternately allocated to each memory resource. For example, in an interleaved first cache and second cache of a CR buffer, if logical address 0 is allocated to the first cache (e.g., CRDC 0), then logical address 1 would be allocated to the second cache (e.g., CRDC 1), and logical address 2 would allocated to the first cache (e.g., CRDC 0), and so on. Interleaved memory may enable performance of continuous read, write, and/or movement operations by alternately using each memory resource, instead of repeatedly using the same memory resource. This may enable a higher memory throughput due to a waiting time (e.g., latency) being reduced for performance of read, write, and/or movement operations by each memory resource.

Alternatively or in addition, interleaving the data (e.g., segments of a page or a plurality of pages) may, in a number of embodiments, mean that a first portion of the data (e.g., a first segment) is moved to and/or from a first memory resource (e.g., the first cache of the CR buffer) in a time period that at least partially overlaps with a time period in which a second portion of the data (e.g., a second segment) is moved to and/or from a second memory resource (e.g., the second cache of the CR buffer). For example, during a time period in which the first segment is being moved (e.g., written) from the first cache (e.g., to a dedicated I/O line), at least part of the second segment may be moved (e.g., read) to the second cache (e.g., from the secondary data cache of the page buffer).

Ordinal numbers such as first and second and/or primary and secondary are used herein to assist in correlating and/or distinguishing between similar and/or selectably coupled components (e.g., segments of data and/or data caches, etc.) and are not used to indicate a particular ordering and/or relationship between the components, unless the context clearly dictates otherwise (e.g., by using terms such as adjacent, etc.).

FIG. 2 is a block diagram of an apparatus in the form of a memory device system 204 configured to perform continuous read operations in accordance with a number of embodiments of the present disclosure. The memory device system 204 shown in FIG. 2 may, in a number of embodiments, illustrate an example of single unit of the memory devices 124-0, . . . , 124-M-1 illustrated and described in connection with FIG. 1 that may be utilized for performance of the continuous read operations as described herein. A memory device 124 may be configured as a volatile memory resource (e.g., DRAM, among other volatile memory device configurations) and/or as a non-volatile memory resource (e.g., NAND, among other non-volatile memory device configurations).

As described in connection with FIG. 1, the memory device system 204 illustrated in FIG. 2 may include a number of memory interfaces (e.g., buses 122) for coupling a particular device controller 220 of the memory device system 204 to a particular memory device 124 (e.g., for input and/or output of data, programming operations, commands, etc., as directed, by the device controller 220).

The memory device system 204 may, in a number of embodiments, include a number of arrays 228 of memory cells, as described herein. As one example, at least one array 228 may be a NAND flash array that may include pages associated with a number of word lines (not shown). In a number of embodiments, each page may correspond to a particular row (e.g., line) of memory cells in the array. The page may have a data storage capacity of 2048 (2K) bytes. Each array 228 may include a number of physical rows (pages) of memory cells that may each be coupled to a respective word line (e.g., access line). The number of pages may be 32, 64, or 128, but embodiments are not limited to a particular number of pages and/or rows. Each row coupled to a word line may include a number of physical pages of cells. A physical page of cells may refer to a number of memory cells that may be programmed, read, and/or written together or as a functional group. For example, each row may, in a number of embodiments, include one or multiple physical pages of cells (e.g., an even page associated with cells coupled to even-numbered bit lines, and an odd page associated with cells coupled to odd numbered bit lines).

Additionally, for embodiments including multilevel cells, a physical page may store multiple logical pages of data with each cell in a physical page contributing a bit toward a logical lower page, a bit toward a logical upper page, and one or more bits toward a respective number of logical intermediate pages. However, embodiments of the present disclosure are not limited to such configurations.

The NAND device described as an example of an array 228 for the memory device system 204 illustrated in FIG. 2 may, in a number of embodiments, include a number of NAND dies (e.g., NAND flash arrays) that have single level cells (SLCs) configured to store a single data unit (e.g., one bit), and/or multilevel cells (MLCs) configured to store more than one data unit. Additionally, the cells may be programmable via various different programming processes, which may depend on the quantity of data units stored per cell; however, cells configured to store a particular quantity of data units (e.g., 2 bits, 3 bits, 4 bits, etc.) per cell may be programmable via different programming processes. For example, a 3-bit MLC might be programmable via a two-pass programming process (e.g., a 4-8 process in which a first programming pass places the threshold voltage of the cells from an erase state into one of four distributions based on a lower page and middle page data state and in which a second programming pass places the threshold voltage of the cells from the one of four distributions into one of eight distributions based on the upper page data state), or a three-pass programming process (e.g., a 2-4-8 process).

The system controller 118 described in connection with FIG. 1 may be configured to control performance of a read operation, as described herein, on data in a page buffer 226 and/or a CR buffer 227. A read operation controlled by the system controller 118 and/or directed by the device controller 220 may be associated with data movement among the plurality of caches of the page buffers 226 and/or CR buffers 227. As shown and described in connection with FIG. 2 and elsewhere herein, the data movement may include, for example, moving data (e.g., data corresponding to one page) accessed (e.g., sensed and/or read) from a page of array 228 and stored by a primary cache 232 and moved to a secondary data cache 233 of the page buffer 226 such that the primary cache 232 is available for movement of additional accessed data corresponding to a different (e.g., sequentially next) page from array 228 responsive to a read command from the system controller 118 to the device controller 220.

A read operation that may be performed responsive to the read command from the system controller 118 may include moving a page of data (e.g., a number of segments of data corresponding to the page of data) stored by the page buffer 226 to the CR buffer 227 such that a plurality of caches (e.g., SDC 233 and/or PDC 232) of the page buffer 126 are available for movement (e.g., input) of a different page of data (e.g., responsive to the read command from the system controller 118). As an example, responsive to the read command from the system controller 118, the device controller 120 may be configured to direct that data are moved from the primary cache (e.g., PDC 232) to the secondary cache (e.g., SDC 233) via I/O line 229-3 and from the secondary cache to the CR buffer 227 via I/O line 239.

In a number of embodiments, the device controller 220 may be configured to initiate performance of the read operation, responsive to the read command from the system controller 118, by directing read circuitry 230 to access (e.g., read and/or store) a particular page and/or sequence of pages from the array 228 (e.g., via I/O line 229-1) and to enable movement of one page of the accessed data from the read circuitry 230 to the primary cache 232 (e.g., via I/O line 229-2).

A read (e.g., access and/or sense) operation may utilize the read circuitry 230 to determine (e.g., via a sense amplifier) a data state of a number of memory cells (not shown) to enable performance of the read operation. The data state may, in a number of embodiments, be determined as a state of a storage element of the memory cell by reading (e.g., sensing) a characteristic of a signal, for example, on a bit line (not shown) associated with the respective memory cell responsive to a particular voltage applied to the selected word line to which the respective memory cell is coupled. Sensing can include sensing a change in voltage, current, amplitude, and/or slope (e.g., a time derivative of a parameter of the signal) of a signal associated with the respective memory cell, among other characteristics of the signal.

The read circuitry 230 also may, in a number of embodiments, be configured to enable performance of a write operation by possibly altering (e.g., erasing and/or replacing) a data state of a number of memory cells in the array 228 and/or outputting the result of the write operation from the read circuitry 230 to the primary cache 232 of the page buffer 226. The read circuitry 230 also may, in a number of embodiments, be configured to enable performance of a compute operation (e.g., by a compute component (not shown) being coupled to the sense amplifier) with a result of the compute operation being written to a number of memory cells in the array 228 and/or outputted from the read circuitry 230 to the primary cache 232 of the page buffer 226. A compute operation may be, for example, a Boolean operation, such as AND, OR, NOT, NOT, NAND, NOR, and XOR, and/or other operations (e.g., invert, shift, arithmetic, statistics, among many other possible operations) that may involve manipulating data.

A read operation performed responsive to a first read command 243 from the system controller 118 (e.g., via the read interface 119 directed to the I/O interface 208) may include moving data (e.g., a page of data accessed from the array 228) from the secondary cache 233 of the page buffer 226 to the host 102. The secondary cache 233 of the page buffer 226 may be selectably coupled to the host 102 via the secondary cache 233 being selectably coupled via I/O line 229-4 to I/O interface 208. In contrast, a read operation performed responsive to a second read command (e.g., as shown at 462 and described in connection with FIG. 4) from the system controller 118 may include moving data (e.g., a plurality of segments of data corresponding to a page or a plurality of pages of data accessed from the array 228) alternately from the first cache 237-0 and from the second cache 237-1 of the CR buffer 227 to the host 102. The first cache 237-0 and the second cache 237-1 of the CR buffer 127 may be selectably and alternately coupled to the host 102 via being selectably coupled via I/O line 240 to I/O interface 208.

The primary cache 232 and secondary cache 233 of page buffer 226 each may include a number of memory cells for storage of a number of data values that corresponds to a page of memory in the array 228 to which the page buffer 226 is selectably coupled (e.g., as shown and described in connection with FIG. 3). The CR buffer 227 may include a first cache (CRDC 0) shown at 237-0 and a second cache (CRDC 1) shown at 237-1. Each CRDC 237 of the CR buffer 227 may include a number of memory cells for storage of a number of data values that corresponds to a segment of a page of memory in the array 228 to which the CR buffer 227 is selectably coupled via the page buffer 226 (e.g., as shown and described in connection with FIG. 3). The CR buffer 227 also may include a logic component 238. The logic component 238 may, in a number of embodiments, include logic circuitry configured to perform logical operations, such as Boolean logic and/or other operations (e.g., invert, shift, arithmetic, statistics, among many other possible operations) that may be involved with manipulating data. For example, the logic component 238 may control and/or direct interleaving, as described herein, of segments of a page or a plurality of pages alternately moved (e.g., read) to and/or alternately moved (e.g., written) from CRDC 0 at 237-0 and CRDC 1 at 237-1.

Segments, as used herein, are intended to mean a first portion of data corresponding to a first segment of a page or a plurality of pages that is selected by the host 102 to be read in a read command, followed by a sequential second portion of data corresponding to second segment of the page or the plurality of pages selected by the host 102 to be read, and followed by a sequential third portion of data corresponding to third segment of the page or the plurality of pages selected by the host 102 to be read, and so on if there are more than three segments. For example, a first segment may be moved to and/or from the first cache 237-0 of the CR buffer 227, a second segment may be alternately moved to and/or from the second cache 237-1 of the CR buffer 227, and a third segment may be alternately moved to and/or from the first cache 237-0 of the CR buffer 227, etc., so as to be interleaved, as described herein. As shown and described in connection with FIG. 3, there may be a particular number of segments (e.g., 4, 8, 16, 24, 32, etc., segments, among other possibilities) that comprise each page of data.

As illustrated in FIG. 2, the secondary cache 233 of the page buffer 226 and/or the first cache 237-0 and the second cache 237-1 of the CR buffer 227 may be coupled to an ECC engine 234. The secondary cache 233 and the first cache 237-0 and the second cache 237-1 may, in a number of embodiments, be coupled to the ECC engine 234 via a dedicated I/O line 239 shared between and selectably coupled to the ECC engine 234, the secondary cache 233, and the first and second caches 237-0, 237-1.

The ECC engine 234 may include a number of error correction codes 235. The number of codes 235 may, in a number of embodiments, be a plurality of error correction codes selectable (e.g., as options) based upon particular characteristics determined for a particular data error. Determination (e.g., identification) of the particular characteristics (e.g., type of data error, number of detected data errors, etc.) may contribute to determination of which of the codes 235 is to be utilized for error correction or whether the error is not to be corrected (e.g., based on a decision according a predetermined repair protocol). For example, determination of one of the codes 235 (repair options) to be selected may, in a number of embodiments, include presenting the particular characteristics of the detected data error as a type of data error selected from a single-bit correctable error (SCE), a multi-bit correctable error (MCE), and/or a multi-bit uncorrectable error (MUE), among other possible types of error.

In a number of embodiments, the host 102 (e.g., the host processor 105 and/or the system controller 118) and/or the memory device system 204 (e.g., the device controller 220) may be configured to select at least one of the codes 235 (e.g., options) for error repair based upon a predetermined (e.g., stored) repair protocol that uses various factors related to, for example, the requested read operation, the data error itself (e.g., the type of data error and/or the number of data errors), and/or the address of the data error, among other possible factors, to make a determination of the option to select. The options for error repair presented to the stored repair protocol may include presenting the detected data error as a type of data error selected from a SCE, a MCE, and/or a MUE, among possible other types of data errors, which may be included in the factors related to the data error itself that influence selection from the error repair options.

The type of data may, in a number of embodiments, correspond to data including instructions to enable performance of a particular type of operation. The instructions may be code (bits) to enable a particular one of the codes 235 (e.g., ECC operations) by ECC circuitry and/or microcode (bits) to enable performance of microcode-directed operations directed by a controller (e.g., a state machine 236), among other types of data and operations. The ECC bits may each be one or more data values stored as code bits to enable error correction by the ECC circuitry. In a number of embodiments, the ECC bits may be stored by and/or retrieved from ECC data 353 included in page data 329 for a page and/or a segment of a page (e.g., as shown and described in connection with FIG. 3).

The state machine 236 may, in a number of embodiments, be logic. An example of such logic, as described herein, may be hardware (e.g., in the form of an ASIC) and/or firmware to implement one or more particular functions as an embedded processing resource of the ECC engine 234. The state machine logic may include instructions (e.g., commands) to implement and/or interpret ECC code and/or microcode. Alternatively or in addition, the state machine 236 may be coupled to receive signals from a clock (not shown) (e.g., a clock internal to the memory device system 204 as opposed to a clock 241 coupled to and/or a part of the I/O interface 208) that may, in a number of embodiments, be configured to provide clock cycles (e.g., signals 246 corresponding to the internal clock cycles) to enable synchronized timing of read sub-operation performance. Such internal clock cycle signals 246 may, in a number of embodiments, correspond to a number of clock cycles (e.g., one or more clock cycles referred to herein as a clock phase) that may be utilized for synchronization of movement and/or operations (e.g., copies, transfers, reads, writes, data error correction, etc.) of segments of a page or a plurality of pages between the primary cache 232, the secondary cache 233, the ECC engine 234, the first cache 237-0, and the second cache 237-1.

The I/O interface 208 may, in a number of embodiments, be configured to receive (e.g., input) commands (CS) 242 and/or data from the host 102 via the system controller 118 and/or read interface 119 to the device controller 220, read circuitry 230, array 228, and/or ECC engine 234. The I/O interface 208 may be configured to output results of a read operation, as described herein, to the host 102 via the system controller 118. The results of a particular read operation (e.g., as directed by the read interface 119) outputted by the I/O interface 208 may be a single page 244 or a plurality of pages stored by and moved from the secondary cache 233 as complete pages to the I/O interface 208 via the selectably coupled I/O line 229-4. Alternatively, the results of the particular read operation outputted by the I/O interface 208 may be sequential segments of a single page 245 or a sequential series of pages stored by and moved from the CR buffer 227 to the I/O interface 208 via the selectably coupled I/O line 240 in a continuous read operation (e.g., as directed by the read interface 119).

Accordingly, as described herein, a memory device included in a memory device system (e.g., at least one of memory devices 124-0, . . . , 124-M−1 in memory device system 104 shown in FIG. 1) may include an array (e.g., 228) having a plurality of pages of memory cells. A page buffer (e.g., 226) may be selectably coupled to the array 228. The page buffer may include a plurality of caches each configured to store a plurality of data values that corresponds to a number of the memory cells of a page. The memory device 124 also may include a CR buffer (e.g., 227). The CR buffer 227 may include a first cache (e.g., 237-0) configured to receive a first segment of the data values from the page buffer 226 and a second cache (e.g., 237-1) configured to receive a second segment of the data values from the page buffer. The first cache 237-0 and the second cache 237-1, along with the respective first and second segments are further described elsewhere herein (e.g., as shown in and described in connection with FIGS. 3-5). The memory device 124 may be configured to perform a continuous read operation on the first and second segments of data from the first cache 237-0 and the second cache 237-1 of the CR buffer 227.

The first cache 237-0 may be configured to store the first segment of the data values, the second cache 237-1 may be configured to store the second segment of the data values, and the first and second segments may be contiguous segments of the page (e.g., subsets of data values of the page where the subsets are sequentially positioned). The first cache 237-0 and the second cache 237-1 may be configured to receive the first segment and the second segment independently and sequentially. For example, by being alternately received (e.g., interleaved) by the first cache and the second cache, a first segment, a second segment, a third segment, and a fourth segment, etc., are independently and sequentially received by the first cache and the second cache, respectively.

The plurality of caches of the page buffer 226 may, in a number of embodiments, include a primary cache (PDC) 232 selectably coupled to the array 228 (e.g., via I/O lines 229-1 and/or 229-2). The primary cache 232 may be configured to store the plurality of data values accessed (e.g., received) from the number of the memory cells of the page. The plurality of caches of the page buffer 226 also may include a secondary cache (SDC) 233 coupled to the primary cache 232. The secondary cache 233 may be configured to receive, from the primary cache 232 (e.g., via I/O line 229-3), and store the number of data values that correspond to the page. The secondary cache 233 of the page buffer 226 may be coupled to the CR buffer 227 to selectably move segments of the data values from the secondary cache 233 to the CR buffer 227. The CR buffer 227 may be selectably coupled (e.g., via I/O line 240) to move the segments of the data values to an output interface (e.g., I/O interface 208) during the continuous read operation.

A system controller (e.g., at 118 on host 102) may include a read interface (e.g., 119) configured to send a plurality of read commands (e.g., at 242) to a device controller (e.g., to device controller 220 via I/O interface 208) of the memory device 124. The read commands may, in a number of embodiments, include a first command to read the page of data values for storage by the page buffer 226 and a second command to continuously read the plurality of pages, corresponding to a plurality of segments of data values of each of the plurality of pages, sequentially stored by the CR buffer 227. The first command to initiate the operation by storage of the page of data values by the page buffer 226 and the second command to perform the continuous read operation on the segments sequentially stored by the first cache 237-0 and the second cache 237-1 of the CR buffer 227 are further described elsewhere herein (e.g., as shown in and described in connection with FIGS. 3-5). In a number of embodiments, a command between the first and second commands may direct sequential movement of a plurality of segments of data values from the page buffer 226 to the CR buffer 227, The plurality of segments may be moved alternately (e.g., as directed by a logic component 238 of the CR buffer 227) from the first cache 237-0 and the second cache 237-1 to the coupled I/O line 240. The first cache 237-0 and the second cache 237-1 may, in a number of embodiments, be configured, during the continuous read operation, to interleave output of the first segment, to the I/O line 240, with at least a portion of the second segment being received by the second cache 237-1. For example, the first segment may be moved (e.g., written) from the first cache 237-0 to I/O line 240 in a time period that at least partially overlaps with a time period in which the second segment is moved (e.g., read) to the second cache 237-1 from the secondary cache 233.

Figure 3:
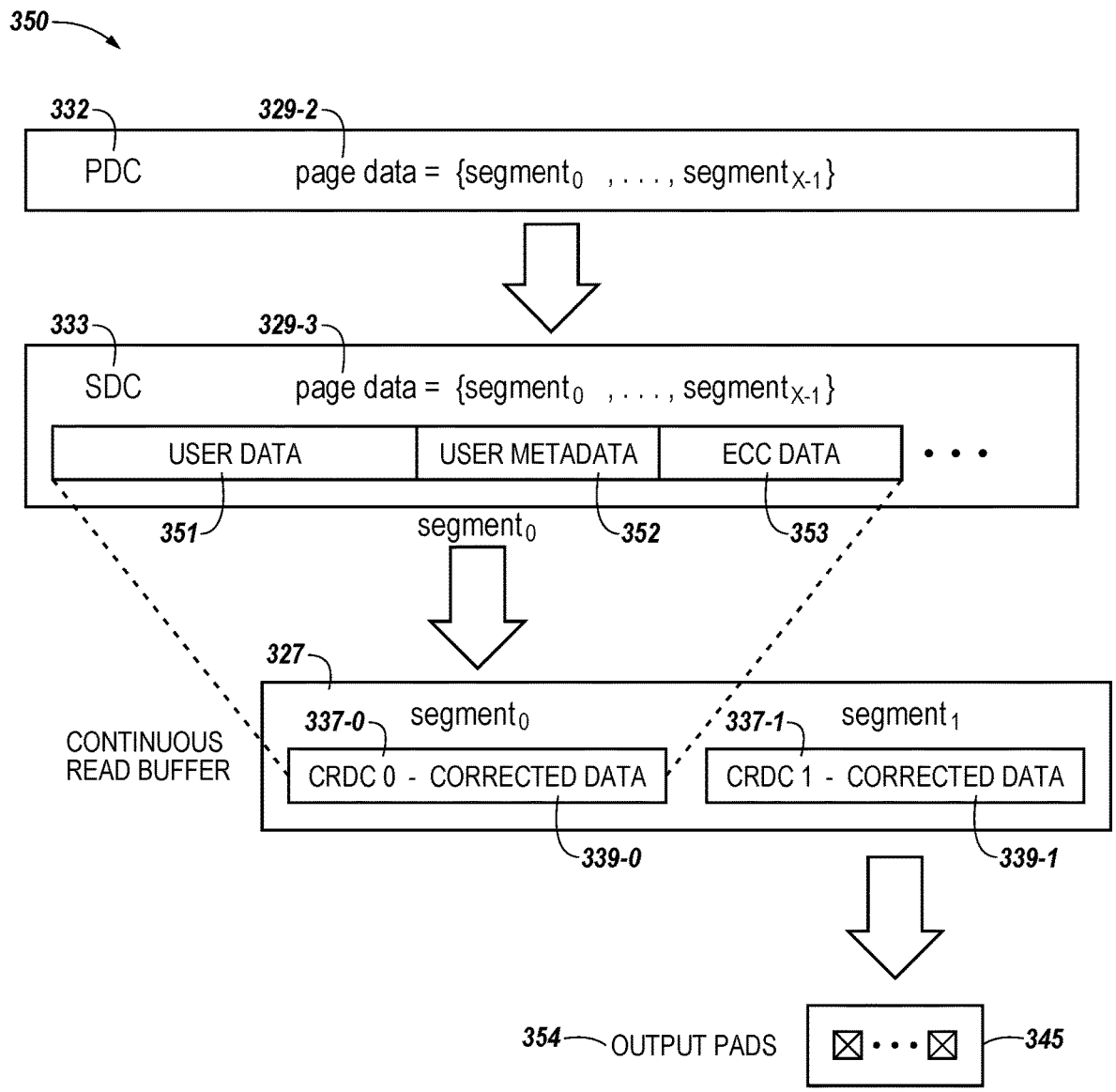
FIG. 3 is a block diagram of a plurality of caches corresponding to a page buffer and a continuous read buffer configured to perform continuous read operations in accordance with a number of embodiments of the present disclosure.

FIG. 3 is a block diagram of a plurality of caches 350 corresponding to a page buffer and a CR buffer configured to perform continuous read operations in accordance with a number of embodiments of the present disclosure. The plurality of caches 350 shown in FIG. 3 illustrate a primary cache (PDC) 332 and a secondary cache (SDC) 333 of a page buffer 226 and a first cache (CRDC 0) 337-0 and a second cache (CRDC 1) 337-1 of a CR buffer 327.

As described herein, the primary cache 332 may be configured to receive and store a page of data 329-2 (e.g., corresponding to the data moved by I/O line 229-2) accessed and/or read via the read circuitry 230 from a page of the array 228. The page data 329-2 may be coded (e.g., as defined bits) so as to be separable into a plurality of sequential segments (e.g., $segment_0$, $segment_1$, . . . , $segment_{x-1}$). The page data 329-2 may be moved from the primary cache 332 so as to be stored as page data 329-3 by the secondary cache 333. The page data 329-3 stored by the secondary cache 333 still may be coded so as to be separable into $segment_0$, $segment_1$, . . . , $segment_{x-1}$.

In a number of embodiments, each of the segments may be coded or codable as distinguishable portions (e.g., sequences of bits) of data. For example, $segment_0$ is shown to be coded with a portion including user data 351, a portion including user metadata 352, and a portion including ECC data 353, although a segment is not limited to these three portions of data. The user data 351 may be data values programmed and stored, for example, to record information and/or for use in performance of a particular operation, among other possible uses. The user metadata 352 may be data values programmed and stored to record information about the user data 351, such as, for example, a field, name, and/or version of such user data, a date on which the user data was stored, by whom the user data was stored, among other possible types of user metadata 352. The ECC data 353 may be data values programmed and stored, for example, to enable the ECC engine 234 to detect whether a data error is present in a segment (e.g., $segment_0$) and/or to determine the type of error when the data error is detected.

In the example illustrated in FIG. 3, $segment_0$ may be moved (e.g., read) from the secondary cache 333. $Segment_0$ may, in a number of embodiments, be moved to the CR buffer 327. For example, when $segment_0$ is a first segment read on a page during a read operation, $segment_0$ may be moved to a first cache 337-0 of the CR buffer 327. Following movement of $segment_0$ to the first cache 337-0, $segment_1$ of the page may be read and moved from the secondary cache 333 to the second cache 337-1 of the CR buffer 327.

As described herein, segments 0, 1, ..., X–1 that are moved to the first cache 337-0 and second cache 337-1 of the CR buffer 327 may, in a number of embodiments, include corrected data, for example, as shown at 339-0 for segment$_0$ and at 339-1 for segment$_1$. The corrected data 339 results from the corresponding segment being moved to the ECC engine 234 for detection and/or correction of detected data errors based upon analysis of the ECC data 353 portion of the segment. As described herein, each segment 0, 1, ..., X–1 may, in a number of embodiments, be moved sequentially from the secondary cache 333 to the ECC engine 234 for data correction prior to the corrected data 339 being moved sequentially to the CR buffer 327. Alternatively, each segment 0, 1, ..., X–1 may, in a number of embodiments, be moved sequentially from the secondary cache 333 to the CR buffer 327 prior to being moved sequentially to the ECC engine 234 for data correction and the corrected data 339 may be subsequently moved sequentially to the CR buffer 327. Alternatively, each segment 0, 1, ..., X–1 may, in a number of embodiments, be moved sequentially from the secondary cache 333 to the CR buffer 327 at substantially the same time as (e.g., simultaneously with) being moved sequentially to the ECC engine 234 for data correction and the corrected data 339 (e.g., only corrected data values) may be subsequently moved to, or corrected in, the CR buffer 327. The corrected data 339 may include detection and/or correction of detected data errors in the user data 351 and/or user metadata 352.

As described in connection with 245 in FIG. 2, the sequential segments of a single page 345 or a sequential series of pages may be alternately moved from the first cache 337-0 and the second cache 337-1 of the CR buffer 327 via the I/O interface 208 for output to the host 102 in a continuous read operation. In a number of embodiments, the sequential series of segments may be outputted from the I/O interface 208 via an I/O PAD 354. The I/O PAD 354 may be, or may include, an I/O circuit that may function as an interface between on-chip components (e.g., the memory device system 204) and off-chip components (e.g., the host 102).

Accordingly, as described herein, a memory device system (e.g., memory device system shown 104 and 204 and described in connection with FIGS. 1-3) may include a memory device (e.g., at least one of memory devices 124-0, ..., 124-M–1 shown in FIG. 1). The memory device 124 may include an array 228 that includes a plurality of pages of memory cells. In a number of embodiments, the array 228 may be NAND flash memory (e.g., either in a serial or parallel NAND architecture) and/or may be another type of non-volatile memory (e.g., in a NOR architecture, among other possibilities). The memory device 124 also may include a primary cache 232 selectably coupled to the array 228 and configured to store a plurality of data values accessed from a number of the memory cells of a page and a secondary cache 233, coupled to the primary cache 232, configured to store the plurality of data values received from the primary cache that correspond to the page. The memory device 124 also may include an ECC engine 234 selectably coupled to the CR buffer 227.

The memory device system 204 also may include (e.g., be coupled to via an I/O interface 208) a host 102 configured to control performance of a continuous read operation on a plurality of segments of data values on each of the plurality of pages. For example, the host 102 may control performance of the continuous read operation on the plurality of segments of data values by issuing (e.g., sending) a read command to a device controller 220 of the memory device system 204 such that the device controller 220 directs that a first segment of the plurality of segments is stored by a first cache 237-0 and a second segment of the plurality of segments is stored by a second cache 237-1 of the CR buffer 227.

The memory device system 204 also may include read circuitry 230 that couples the primary cache 232 to the array 228. The primary cache 232 may be selectably coupled, via the read circuitry 230, to access a data value of the plurality of data values stored by a particular memory cell of the page for movement to the primary cache.

The primary cache 232, the secondary cache 233, and/or the first cache 237-0 and the second cache 237-1 of the CR buffer 227 may, in a number of embodiments, each be independent (e.g., separate and/or independently operable by the device controller 220) RAM devices (e.g., selected from DRAM and SRAM, PCRAM, and/or MRAM, among others). A data storage capacity of a RAM device of the primary cache 232 and/or the secondary cache 233 may correspond to a number of data values of a page of the array. For example, a number of memory cells included in the RAM device of the primary cache 232 and/or the secondary cache 233 may be the same as a number of memory cells included in a page of the array 228 (e.g., 1024 memory cells included in the page and/or a row of the array).

Figure 4:
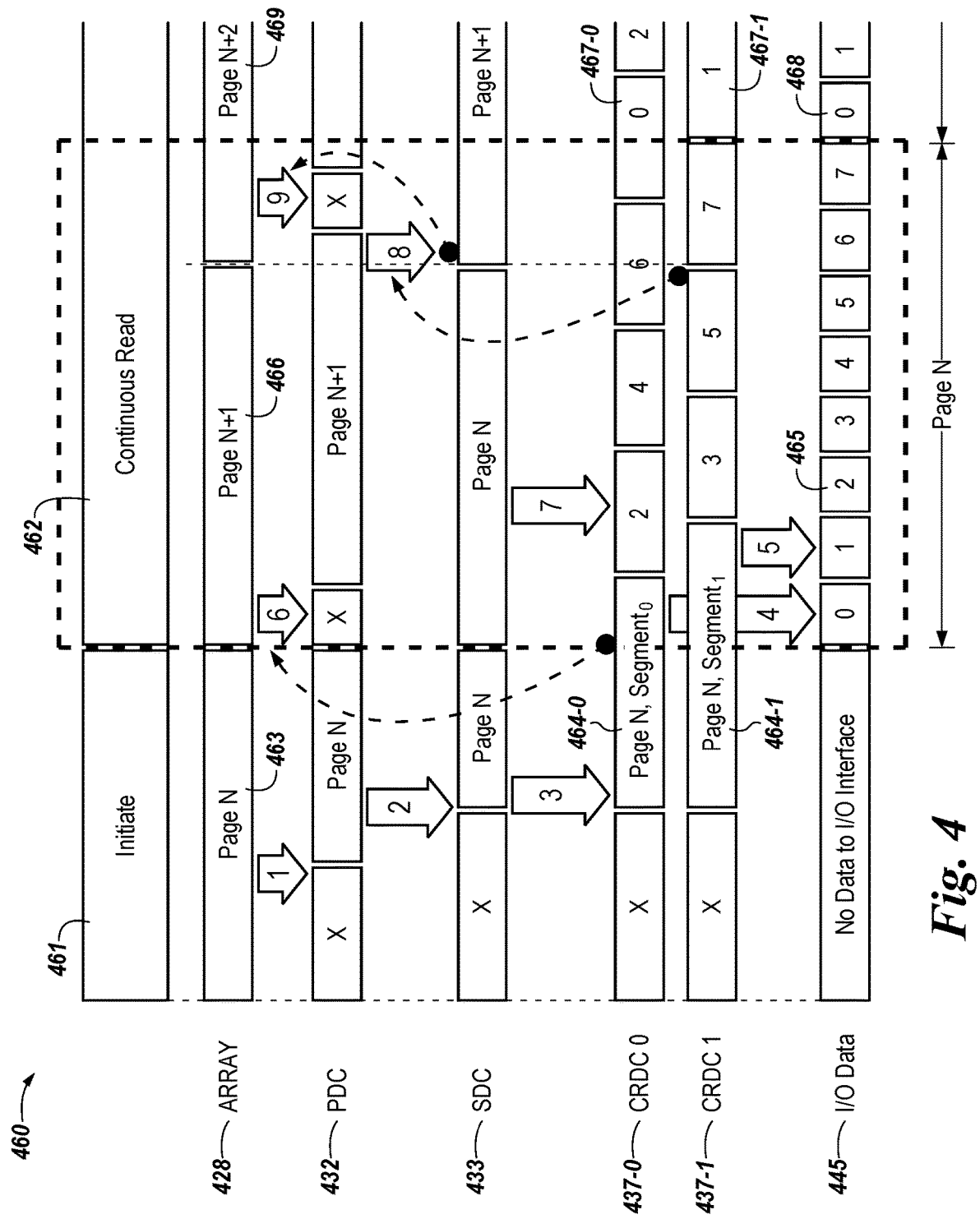
FIG. 4 is a block diagram illustrating an example of performance of a continuous read operation in accordance with a number of embodiments of the present disclosure.
Figure 5:
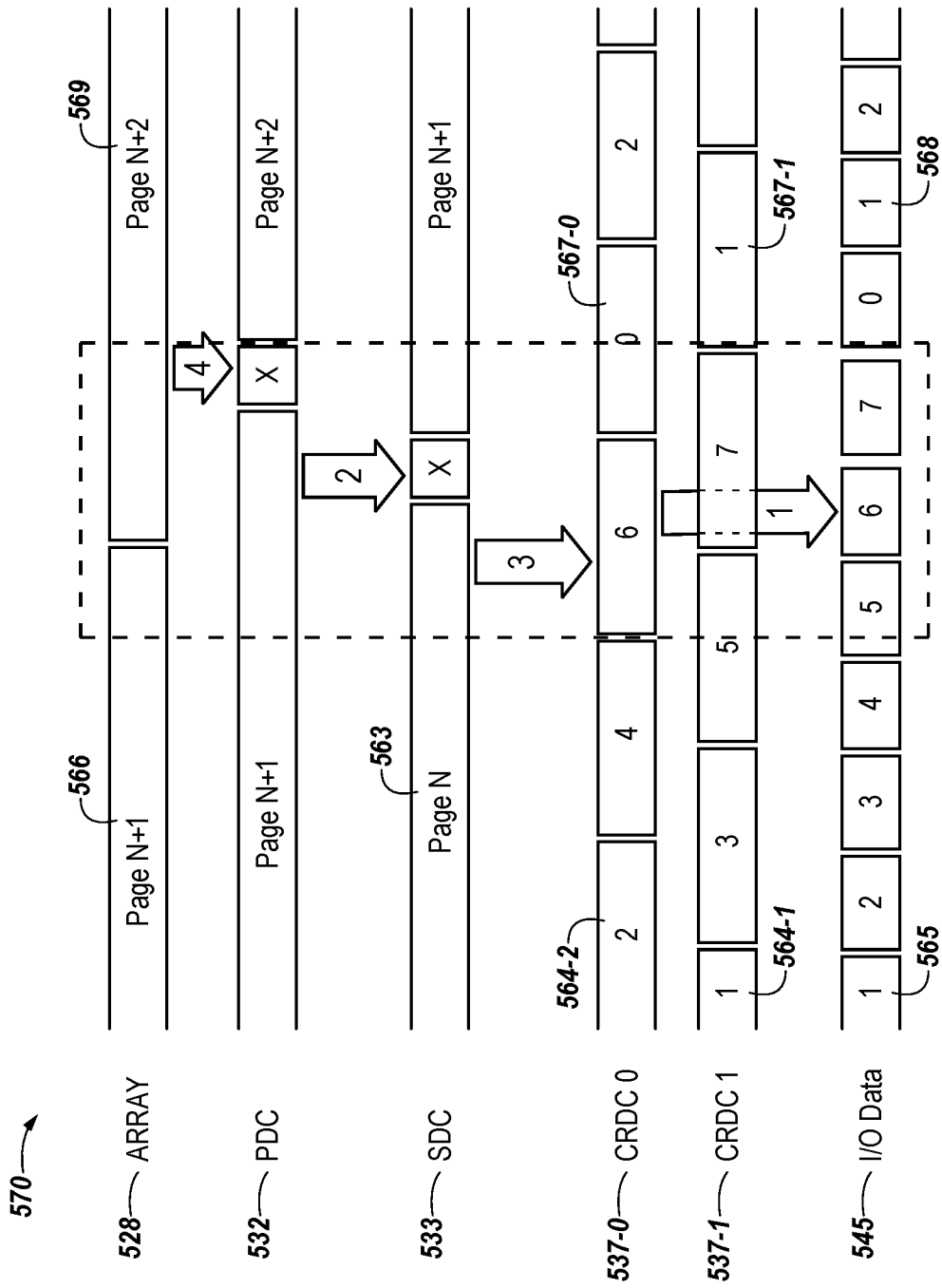
FIG. 5 is a block diagram illustrating another example of performance of a continuous read operation in accordance with a number of embodiments of the present disclosure.

In contrast, a data storage capacity of the first cache 237-0 and the second cache 237-1 may correspond to a number of a plurality of data values in a segment of the page. A number of memory cells included in the RAM device of the first cache 237-0 and the second cache 237-1 may be the same as a number of data values included in a segment of a page. For example, when the page includes 1024 memory cells and the number of segments per page is eight (8), each segment would correspond to 128 memory cells and/or data values. When the number of segments for such a page is 16, each segment would correspond to 64 memory cells and/or data values, and when the number of segments for such a page is 32, each segment would correspond to 32 memory cells and/or data values, and so on. For clarity of illustration, the number of segments per page is shown in FIGS. 4 and 5 to be eight (8) by being numbered as segments 0, 1, ..., 7; however, embodiments are not limited to this number of segments. Accordingly, the storage capacity (e.g., the number of memory cells and/or data values) of the first cache 237-0 and the second cache 237-1 configured to store a segment of a page may be notably lower than the storage capacity of the primary cache 232 and the secondary cache 233 configured to store the whole page.

In a number of embodiments, the device controller 220, on the memory device 124, may be configured to direct that the ECC engine 234 receives, from the secondary cache 233 (e.g., via a selectably coupled I/O line 239), the first segment followed by the second segment. The CR buffer 227 may be coupled to the ECC engine 234 (e.g., via I/O line 239) such that the first cache 237-0 may receive (e.g., store) the first segment from the ECC engine 234 followed by receipt (e.g., storage) by the second cache 237-1 of the second segment from the ECC engine 234. The first segment and the second segment may each include data (e.g., ECC data 353) that enable error detection and correction by the ECC engine 234 prior to movement of the first and second segments to the respective first and second caches 237-0, 237-1.

Alternatively or in addition, the device controller 220 may be configured to direct that the CR buffer 227 is coupled to the secondary cache 233 (e.g., via the selectably coupled I/O line 239) and that the first cache 237-0 receives (e.g., stores) the first segment from the secondary cache 233 and that the second cache 237-1 receives (e.g., stores) the second segment from the secondary cache 233. In a number of embodiments, the device controller 220 may be further configured to direct that the first segment is moved from the first cache 237-0 to a coupled ECC engine 234 (e.g., via the selectably coupled I/O line 239) followed by movement of the second segment from the second cache 237-1 to the coupled ECC engine 234. In a number of embodiments, the device controller 220 may be further configured to direct that the CR buffer 227 and the ECC engine 234 are both simultaneously coupled to the secondary cache 233 (e.g., via the selectably coupled I/O line 239). The device controller 220 may be further configured to direct that the first segment is moved simultaneously to the first cache 237-0 and to the ECC engine 234 (e.g., via the selectably coupled I/O line 239) followed by simultaneous movement of the second segment to the second cache 237-1 and to the coupled ECC engine 234. Accordingly, the first cache 237-0 and the ECC engine 234 may each receive the first segment from the secondary cache 233 at substantially a same first time point and the second cache 237-1 and the ECC engine 234 may each receive the second segment from the secondary cache 233 at substantially a same second time point (e.g., after the first time point).

The first segment and the second segment may each include the data (e.g., ECC data 353) that enable error detection and correction by the coupled ECC engine 234 prior to a write back of the first and second segments to the respective first and second caches. For example, when a segment is moved from the CR buffer 227 to the ECC engine 234 and/or simultaneously to both the CR buffer 227 and the ECC engine 234, the ECC engine 234 may detect and/or correct potential data errors and the write back operation may be performed to only correct data errors in the segment stored by the CR buffer 227 that were actually detected by the ECC engine 234.

In a number of embodiments, the memory device system 204 may include a clock (e.g., pin clock 241) coupled to the I/O interface 208 shown and described in connection with FIG. 2). The pin clock 241 may be accessible to and/or defined by a user to provide a rhythm (e.g., frequency) of moving data from the CR buffer 227 to the I/O interface 208 and/or to the I/O PAD 354. The memory device system 204 also may include an internal clock (not shown) configured to provide clock phases 246 (e.g., signals corresponding to one or more clock cycles) to enable synchronized timing of read sub-operation performance (e.g., movement of data values and/or segments to and/or from the primary, secondary, first, and/or second caches, and/or the ECC engine).

The ECC engine 234 and the CR buffer 227 may, in a number of embodiments, be synchronized such that the first segment is moved, during a first clock phase, from the ECC engine 234 for storage by the first cache 237-0 and the first segment stored by the first cache 237-0 is moved, during a second clock phase, to I/O line 240 coupled to the I/O interface 208 on the memory device 124. The ECC engine 234 and the CR buffer 227 may be further synchronized such that the second segment is moved, during the second clock phase (which is the same clock phase during which the first segment is moved from the first cache 237-0 to I/O line 240), from the ECC engine 234 for storage by the second cache 237-1. The second segment stored by the second cache may be moved, during a third clock phase, to the I/O line 240 coupled to the I/O interface 208. The I/O interface 208 may be configured to move (e.g., output) the plurality of segments of data values of each of the plurality of pages to the host 102 during consecutive clock phases of the continuous read operation (e.g., output one segment of data values per each clock phase until output is completed for the plurality of segments corresponding to the plurality of pages).

A number of a plurality of data values in each segment may, in a number of embodiments, be configured to correspond to a number of a plurality of data values on which the ECC engine 234 is configured to perform error detection and correction during one clock phase prior to correction of data values in the segment for the CR buffer 227. A number of the plurality of segments on a page of the array 228 may be configured to correspond to a number of memory cells on the page divided by the plurality of data values on which the ECC engine 234 is configured to perform the error detection and correction during the one clock phase prior to correction of data values in the segment for the CR buffer 227. For example, when the page includes 1024 memory cells and the ECC engine 234 is configured to perform the error detection and correction on 32 data values per clock phase prior to correction of the segment for the CR buffer 227, there may be 1024÷32=32 segments on each page.

FIG. 4 is a block diagram illustrating an example of performance of a continuous read operation 460 in accordance with a number of embodiments of the present disclosure.

A system controller 118 (e.g., on the host 102) may be configured to send instructions (e.g., a read command) to initiate 461 the continuous read operation 460 and address a particular address of one of the plurality of pages (e.g., page N at 463) in the array 428. A device controller 220 (e.g., on the memory device 124) may be configured to receive the instructions 461 from the system controller 118 and, responsive to the instructions, initiate the continuous read operation and access the particular address of the one of the plurality of pages such that the first segment of data values stored by the particular address (e.g., at page N 463) of the one of the pages is moved to the first cache 437-0.

Initiation of the continuous read operation 460 may include (e.g., as indicated by arrow number 1) storage of a first page (e.g., page N 463) of data values by the page buffer (e.g., the primary cache 432 of page buffer 226), accessed starting at the particular address. Initiation 461 of the continuous read operation 460 also may include (e.g., as indicated by arrow number 2) movement of the first page in the page buffer 226 from the primary cache 432 to the secondary cache 433. Initiation of the continuous read operation 460 also may include (e.g., as indicated by arrow number 3) movement of a first segment$_0$ 464-0 (e.g., segment$_0$ of page N) of a plurality of segments of the first page to the first cache 437-0.

The system controller 118 may be further configured to send instructions (e.g., a continuous read command) to perform 462 the continuous read operation 460 starting at the first cache 437-0 that stores the first segment$_0$ 464-0 of the data values of the page. The device controller 220 may be further configured to receive the instructions 462 from the system controller 118 and, responsive to the instructions, direct performance of the continuous read operation 460, starting at the first cache 437-0.

Performance of the continuous read operation 460, as indicated starting within the boldly dotted lines, may include movement (e.g., writing) of data values of the first segment$_0$ 464-0 from the first cache 437-0 (e.g., as indicated by arrow number 4) followed by movement of data values of a second segment$_1$ 464-1 from a second cache 437-1 (e.g., as indicated by arrow number 5) to an I/O line (e.g., I/O line 240) selectably coupled (e.g., via I/O interface 208) to the host 102. In a number of embodiments, the first segment$_0$ 464-0 may be moved, during a first clock phase, for storage by the first cache 437-0, the first segment$_0$ 464-0 stored by the first cache 437-0 may be moved, during a second clock phase, to the I/O line 240, the second segment$_1$ 464-1 may be moved, during the second clock phase, for storage by the second cache 437-1, and the second segment$_1$ 464-1 stored by the second cache 437-1 may be moved, during a third clock phase, to the I/O line 240. Accordingly, movement (e.g., a read) of the data values of the second segment$_1$ 464-1 to the second cache 437-1 from the secondary cache 433 may be interleaved (e.g., at least partially overlap in the same time period) with movement (e.g., writing) of the data values of the first segment$_0$ 464-0 from the first cache 437-0 to I/O line 240. As described in connection with FIG. 3, the first segment$_0$ 464-0 and the second segment$_1$ 464-1 may have been moved to and from the ECC engine 234 for detection and correction of potential data errors prior to being moved to and/or output from the respective first cache 437-0 and second cache 437-1 of the CR buffer 327.

When (e.g., in a same clock phase with) segment$_0$ 464-0 is moved to the first cache 437-0 of the CR buffer 327, page N+1 466 may, in a number of embodiments, be accessed from the array 428 and moved to the primary cache 432 (e.g., as indicated by a dotted line connected to arrow number 6). Page N+1 466 may replace page N 463 in the primary cache 432, because page N 463 has previously been moved to the secondary cache 433 of the page buffer 226. In a number of embodiments, page N+1 466 may be accessed from the array 428 and moved to the primary cache 432 in a next clock phase following movement of page N 463 to the secondary cache 433 (e.g., prior to the segment$_0$ 464-0 being moved to the first cache 437-0).

When the last data value of the first segment$_0$ 464-0 of page N 463 has been moved from the first cache 437-0 to I/O line 240, the performance of the continuous read operation may proceed to movement (e.g., in a next clock phase) of second segment$_1$ 464-1 from the second cache 437-1 (e.g., as indicated by arrow number 5) to I/O line 240. When (e.g., in a same clock phase with) the second segment$_1$ 464-1 is being moved from the second cache 437-1, a third segment$_2$ of page N 463 may be moved from the secondary cache 433 to the first cache 437-0 of the CR buffer 327 (e.g., as indicated by arrow number 7). The third segment$_2$ of page N 463 may replace the first segment$_0$ of page N 463 in the first cache 437-0 because the first segment$_0$ has previously been moved to I/O line 240.

When a last segment (e.g., segment$_7$) of page N 463 is moved from the secondary cache 433 to the second cache 437-1 of the CR buffer 327, page N+1 466 may, in a number of embodiments, be moved (e.g., in a next clock phase) from the primary cache 432 to the secondary cache 433 (e.g., as indicated by a dotted line connected to arrow number 8). When page N+1 466 is moved to the secondary cache 433, page N+2 469 may be accessed from the array 428 and moved (e.g., in a next clock phase) to the primary cache 432 (e.g., as indicated by a dotted line connected to arrow number 9). Performance of the continuous read operation may continue such that the first segment$_0$ 467-0 of page N+1 466 is moved from the secondary cache 433 to the first cache 437-0 of the CR buffer 327 followed by the second segment$_1$ 467-1 of page N+1 466 being moved from the secondary cache 433 to the second cache 437-1. The segments 468 of page N+1 466 may be alternately moved from the first cache 437-0 and the second cache 437-1 to I/O line 240 for continuous output of data 445 as described in connection with page N 463. Subsequent pages of data 445 may, in a number of embodiments, be similarly output (e.g., to the coupled I/O interface 208 and/or to host 102) in the continuous read operation.

As such, in a number of embodiments, there may be no data output 445 as segments 465 to the I/O interface 208 during the initiation prior to the continuous read command being executed to move the data values of the first segment$_0$ 464-0 from the first cache 437-0 to I/O line 240. However, once the continuous read command has been executed and the first segment$_0$ 464-0 has been moved to I/O line 240, there may be a continuous (e.g., uninterrupted) movement of subsequent and/or sequential segments (e.g., the next one being segment$_1$) until the continuous read operation has been completed (e.g., on segment$_0$, segment$_1$, . . . , segment$_7$ of a plurality of pages). For example, the segments 465 of data 445 are shown as being continuously output to I/O line 240 for page N 463 followed by uninterrupted and continuous output to I/O line 240 of the segments 468 of data 445 for page N+1 466. The continuous output of the segments for pages N, N+1, N+2, etc., may correspond to one segment being output per clock phase (e.g., with pin clock 241 in control of the frequency of movement of the page segments via I/O line 240).

A system controller (e.g., at 118 on host 102) may include a read interface (e.g., 119) configured to send a plurality of read commands (e.g., at 242) to a device controller (e.g., to device controller 220 via I/O interface 208) of the memory device 124. The read commands may, in a number of embodiments, include a first command to move a page of data values stored by the secondary cache 433 to an I/O line (e.g., shown at 229-4 and described in connection with FIG. 2). The I/O line 229-4 may selectably couple the secondary cache 433 to the I/O interface 208 to enable movement of the complete page of data from the secondary cache 433 to the system controller 118 and/or the host 102. The read commands also may include a second command to continuously read the plurality of pages (e.g., pages N, N+1, N+2, etc.), corresponding to the plurality of segments of each of the plurality of pages, stored by the first and second caches 437-0, 437-1 and to move each of the plurality of segments alternately from the first cache 437-0 and the second cache 437-1 to an I/O line (e.g., shown at 240 and described in connection with FIG. 2). The I/O line 240 may selectably couple the first and second caches 437-0, 437-1 to the I/O interface 208 to enable continuous movement of the segments of a page or a plurality of pages of data from the first and second caches 437-0, 437-1 to the system controller 118 and/or the host 102.

FIG. 5 is a block diagram illustrating another example of performance of a continuous read operation 570 in accordance with a number of embodiments of the present disclosure. Other than beginning with the digit 5 instead of 4, the elements shown and described in connection with FIG. 5 are the same as those shown and described in connection with FIG. 4. The elements illustrated in FIG. 5 in connection with performance of the continuous read operation 570 may correspond, at least in part, to the performance of the continuous read operation 460 indicated as starting within the boldly dotted lines in FIG. 4. The illustration and description of FIG. 5 is intended to show how the three levels of caches (e.g., the primary cache 532, the secondary cache 533, and the first and second caches 537-0, 537-1 of the CR buffer 327) are utilized to enable a continuous read operation, as described herein.

As indicated by the dotted lines in FIG. 5, when the last two segments (e.g., segment$_6$ and segment$_7$) of page N 563 are being moved (e.g., written) respectively from the first cache 537-0 and the second cache 537-1 to I/O line 240 (e.g., as indicated by arrow number 1), the secondary cache 533 is available (e.g., ready) to receive page N+1 566. Page N+1 566 may be moved (e.g., in the same clock phase) from the primary cache 532 to the secondary cache 533 (e.g., as indicated by arrow number 2). As described elsewhere herein, the segments of data (e.g., $segment_0$, $segment_1, \ldots, segment_7$) included in page N+1 566 may be moved (e.g., in a number of clock phases corresponding to the number of segments) to an ECC engine (e.g., as shown at 234 and described in connection with FIG. 2) prior to or following alternate (e.g., interleaved) movement of the segments to the first cache 537-0 and the second cache 537-1 of the CR buffer 327 (e.g., as indicated by arrow number 3). Following the movement of page N+1 566 from the primary cache 532 to the secondary cache 533, page N+2 569 may be accessed (e.g., in the next clock phase) from the array 528 and moved to the primary cache 532 of the page buffer 226 (e.g., as indicated by arrow number 4).

A system controller (e.g., at 118 on host 102) may include a read interface (e.g., 119) configured to send a plurality of read commands (e.g., at 242) to a device controller (e.g., to device controller 220 via I/O interface 208) of the memory device 124. The read commands may, in a number of embodiments, include a first command to start the performance (e.g., as shown at 462 and described in connection with FIG. 4) of the continuous read operation at a first particular address of one of the plurality of pages (e.g., pages N, N+1, N+2, etc.) in the array 528. The first command may, in a number of embodiments, enable continued performance of the continuous read operation through a last page in the array (e.g., where the array includes a plurality of pages). The read commands also may include a second command to stop performance of the continuous read operation, started by the first command, at a second particular address of a page different from the first page (e.g., stopping the continuous read operation at a page prior to reaching the last page in the array).

Figure 6:
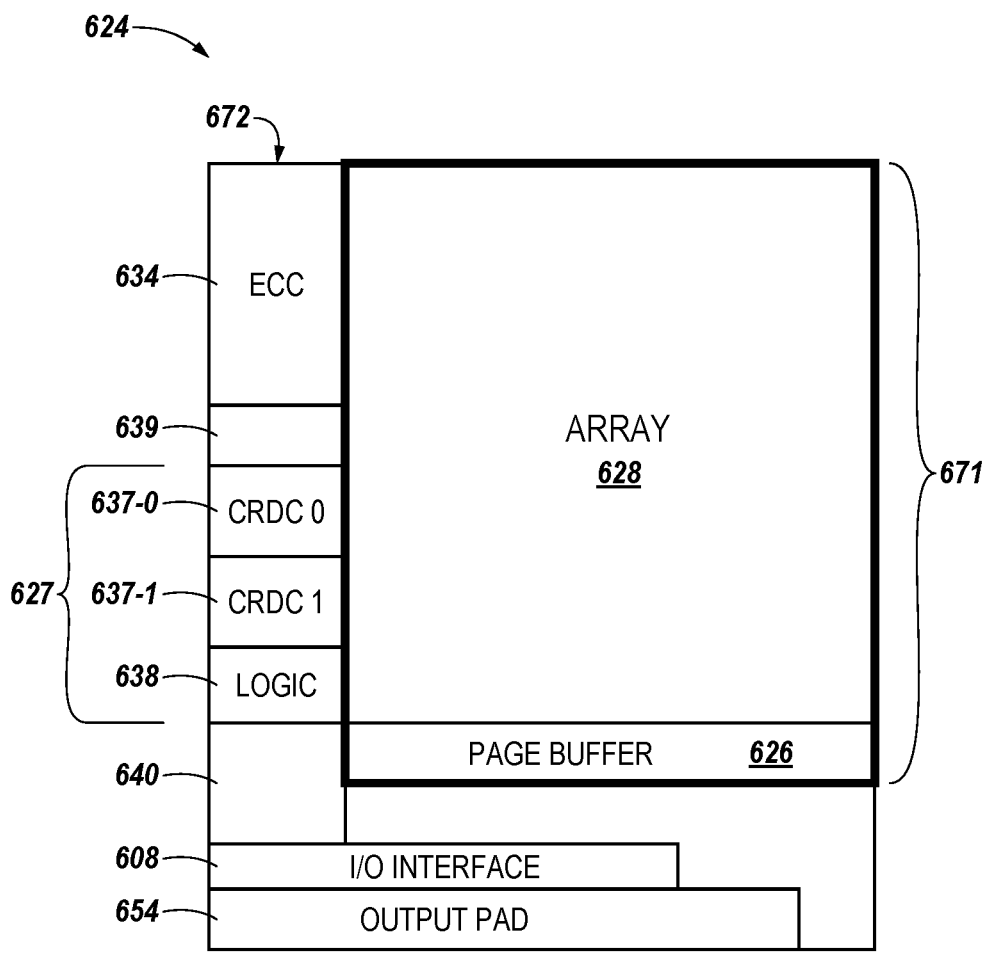
FIG. 6 is a block diagram illustrating an architecture of a memory device configured to perform continuous read operations in accordance with a number of embodiments of the present disclosure.

FIG. 6 is a block diagram illustrating an architecture of a memory device 624 configured to perform continuous read operations in accordance with a number of embodiments of the present disclosure. The embodiment of the memory device 624 illustrated in FIG. 6 is intended to show components representative of those described in the present disclosure and is not intended to show other elements that may contribute to operability of other functionalities of a memory device. Moreover, the components shown are intended to demonstrate relative positioning thereof and are not to be interpreted as demonstrating size, shape, and/or scale of these components relative to each other.

FIG. 6 shows that an array 628 of memory cells and a page buffer 626 (e.g., including a primary cache 532 and secondary cache 533) configured to store a plurality of data values that corresponds to a number of memory cells of a page of an array 628 (e.g., a NAND array), that may be formed in a core region 671 of the memory device 624. In contrast, a CR buffer 627 (e.g., including a first cache 637-0, a second cache 637-1, and/or a logic component 638) may be formed in a peripheral region 672 coupled to the memory device 624. The core region 671 and the peripheral region 672 may be separate regions (e.g., they may occupy separate regions on a chip and/or die that do not overlap).

In a number of embodiments, an ECC engine 634, as described herein, also may be formed in the peripheral region 672 to be selectably coupled by I/O line 639 to the CR buffer 627. The CR buffer 627 may be selectably coupled to an I/O interface 608 via I/O line 640. The I/O interface 608 and/or I/O line 640 may, in a number of embodiments, also be formed in the peripheral region 672. I/O PAD 654 may be, or may include, an interface between on-chip components (e.g., the memory device 624) and off-chip components (e.g., the host 102). The I/O PAD 654 may be coupled to the I/O interface 608. As such, the I/O PAD 654 may, in a number of embodiments, also be formed in the peripheral region 672.

A core region 671 of a particular memory device 624 may have an architecture with a predefined size (e.g., length, width, and/or height) for positioning of memory components therein. For example, the size of the core region 671 may be designed to fit a particular NAND array architecture based upon the number of columns and/or rows of memory cells in the particular NAND array. As described herein, the RAM of a primary cache and/or secondary cache of the page buffer 626 each may include a number of memory cells that corresponds to (e.g., matches with) the number of memory cells in a row or a portion of a row of the particular NAND array. Each of the memory cells of the caches of the page buffer 626 may match a pitch of the memory cells of the particular NAND array.

As such, the NAND array 628 and the page buffer 626 may occupy much (e.g., all) of the predefined size of the core region 671. Accordingly, adding another cache component (e.g., a CR buffer structured similar to the page buffer 626) to the page buffer 626 illustrated in the core region 671 may be problematic (e.g., prevented) based upon the size of the core region 671 already being largely occupied.

The CR buffer 627 described herein reduces the potential size constraints of being fit on the memory device 624. One way to overcome the potential size constraints is that the first cache 637-0 and the second cache 637-1 of the CR buffer 627 are two caches that are each sized to include only enough memory cells to store a number of data values that correspond to one segment of a page. As such, each of the two caches of the CR buffer 627 may have $\frac{1}{8}$, $\frac{1}{16}$, $\frac{1}{32}$, $\frac{1}{64}$, etc., of the number of memory cells in a page buffer 626 cache configured to store a number of data values corresponding to a complete page. Accordingly, in a number of embodiments, a CR buffer 627 configured as such may be designed to fit into the core region 671. Alternatively, another way to overcome the potential size constraints and/or to provide more direct coupling of the CR buffer 627 to the ECC engine 634, the I/O interface 608, etc., among other considerations, is that the CR buffer 627 and associated components may be formed and/or positioned in the peripheral region 672 (e.g., as illustrated in FIG. 6) so as to avoid occupying space in the core region 671.

Figure 7:
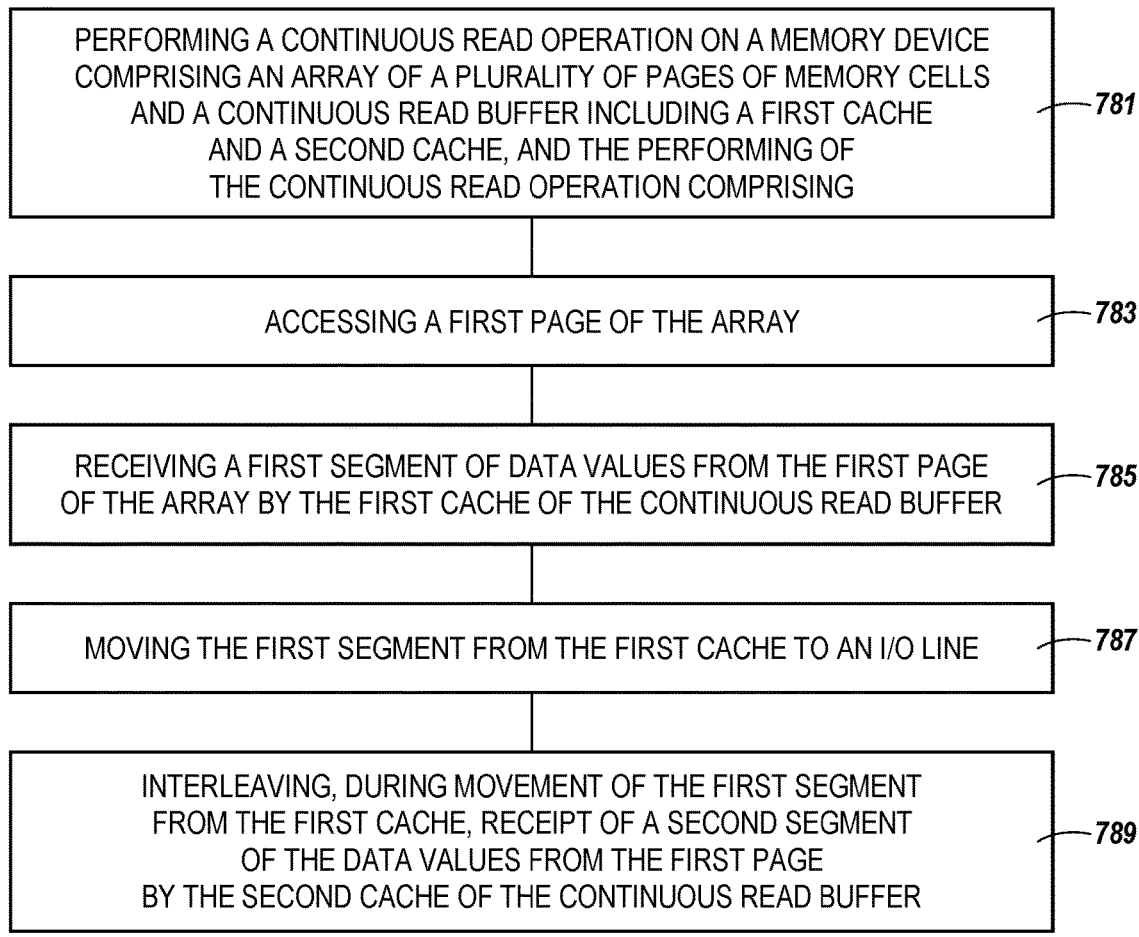
FIG. 7 is a flow chart illustrating an example of operating a memory device to perform continuous read operations in accordance with a number of embodiments of the present disclosure.

FIG. 7 is a flow chart illustrating an example of a method 780 for operating a memory device to perform continuous read operations in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 781, the method 780 may, in a number of embodiments, include performing a continuous read operation on a memory device (e.g., as shown at 124 and described in connection with FIGS. 1 and 2) comprising an array of a plurality of pages of memory cells (e.g., as shown at 128 and described in connection with FIG. 1) and a CR buffer (e.g., as shown at 127 and corresponding indicator numerals and described in connection with FIGS. 1-5) including a first cache and a second cache (e.g., as shown at 437-0 and 437-1, respectively, and described in connection with FIG. 4). Responsive to receiving the instructions (e.g., a read command from system controller 118 described in connection with FIG. 1), the continuous read operation may include a device controller (e.g., as shown at 120 and 220 and described in connection with FIGS. 1 and 2, respectively) of the memory device directing the following sub-operations to enable performance of the continuous read operation.

At block 783, the method 780 may include accessing a first page of the array. At block 785, the method 780 may include receiving a first segment (e.g., as shown at 464-0 and described in connection with FIG. 4) of data values from the first page of the array by the first cache 437-0 of the CR buffer. For example, the method 780 may, in a number of embodiments, include storing a complete first page of data values, accessed from the first page, by a primary cache (e.g., as shown at 232 and corresponding indicator numerals and described in connection with FIGS. 2-5) on the memory device, moving the complete first page of data values, from a coupled primary cache (e.g., coupled via I/O line 229-3 shown and described in connection with FIG. 2), to a secondary cache (e.g., as shown at 233 and corresponding indicator numerals and described in connection with FIGS. 2-5) on the memory device. The method 780 also may include moving sequential segments of the first page, from a coupled secondary cache (e.g., selectably coupled via I/O line 239 shown and described in connection with FIG. 2), alternatively to the first and second caches of the CR buffer.

At block 787, the method 780 may include moving the first segment from the first cache to a coupled I/O line (e.g., as shown at 240, 445, and 545 and described in connection with FIGS. 2, 4, and 5, respectively). At block 789, the method 780 may include interleaving, during movement of the first segment from the first cache, receipt of a second segment (e.g., as shown at 464-1 and described in connection with FIG. 4) of the data values, accessed from the first page, by a second cache of the CR buffer (e.g., as shown at 437-1 and described in connection with FIG. 4). Examples of interleaving receipt of the second segment by the second cache with movement of the first segment from the first cache are shown in FIGS. 4 and 5 by a first segment (e.g., segment$_0$ shown at 464-0 and 567-0) being moved (e.g., written) from the first cache (e.g., 437-0 and 537-0) in a time period (e.g., a clock phase) that partially overlaps with a time period (e.g., in the same clock phase) in which a second segment (e.g., segment$_1$ shown at 464-1 and 567-1) is moved (e.g., read) to the second cache (e.g., 437-1 and 537-1) of the CR buffer.

In a number of embodiments, the method 780 may include performing the continuous read operation on sequential segments, accessed from the first page, such that the sequential segments are moved alternately from the first cache coupled to the I/O line and the second cache coupled to the I/O line (e.g., as shown and described in connection with FIGS. 3-5 and elsewhere herein). Accordingly, the method 780 may, in a number of embodiments, further include receiving a third segment (e.g., a last segment, which may correspond to segment$_7$ shown in FIGS. 4 and 5) of data values, accessed from the first page (e.g., page N shown at 463 and 563), by the first cache (e.g., which may be either cache 437-0 or 437-1 depending upon a number of segments in a page) and moving the third segment from the first cache to the coupled I/O line 240. The method 780 may further include interleaving, during movement of the third segment from the first cache, receipt of a fourth segment (e.g., a first segment, which may correspond to segment$_0$ shown at 467-0 and 567-0 in FIGS. 4 and 5, respectively) of the data values, accessed from a consecutive second page (from page N+1 shown at 466 and 566 in FIGS. 4 and 5, respectively), by the second cache.

The method 780 may further include performing the continuous read operation on sequential segments, accessed from the consecutive first and second pages, such that the sequential segments are moved alternately from the first cache coupled to I/O line 240 and the second cache coupled to I/O line 240. The sequential segments of a consecutive first page, second page, and third page, etc., may be moved via the I/O line 240 to the I/O interface 208 described herein to be selectably moved to the system controller 118, memory 116, and/or processor 105 of the host 102 in response to the command 462 to perform the continuous read operation.

In a number of embodiments, the method may further include increasing a throughput of reading a plurality of data values stored by a plurality of pages on memory cells of the array. The throughout may be increased by interleaving the movement of the first segment from the first cache coupled to the I/O line, to enable output of the first segment to a host, with the receipt of the second segment of the data values by the second cache to enable an output rate for the caches that corresponds to a clock cycle rate for the memory device. The throughput may be increased as such relative to other implementations in which the plurality of data values stored by the plurality of pages are sequentially coupled as complete pages to the I/O line. For example, as described in connection with FIG. 2, the secondary cache 233 of the page buffer 226 may be coupled via I/O line 229-4 to send a complete page of data responsive to a first read command 243 followed by another complete page of data to the I/O interface 208 responsive to a second read command 243.

In a number of embodiments, the method may further include decreasing a latency of reading a plurality of data values stored by a plurality of pages on memory cells of the array (e.g., a continuous read of data values stored on pages N, N+1, N+2, etc.). The latency may be decreased by initiating performance of the continuous read operation responsive to receipt of a single read command at 461 to read the plurality of data values stored by the plurality of pages on memory cells of the array to enable an output rate (e.g., responsive to a single continuous read command at 462) for the first and second caches that corresponds to a clock cycle rate for the memory device. The latency may be decreased as such relative to receiving separate commands to initiate a read of the plurality of data values for each page of the plurality of pages (e.g., separate commands to read page N, then N+1, then N+2, etc., from the array) and/or receiving separate commands to initiate output of the read plurality of data values for each page of the plurality of pages (e.g., separate commands to output page N, then N+1, then N+2, etc., from the secondary cache 233).

The increased throughput and/or decreased latency of a continuous read operation, as described herein, may enable output of continuous and sequential segments of a plurality of pages so as to approach (e.g., match) a potential bandwidth of a memory device system (e.g., by output of one segment of data per each clock phase). For example, a memory device system may have a potential bandwidth of 10 MB/s and the throughput of the segments during performance of the continuous read operation, as described herein, also may be 10 MB/s. In contrast, a throughput when separately outputting complete pages from the secondary cache, as described herein, may be approximately 7 MB/s.

As such, the throughput achieved by continuous output of page segments during the continuous read operation may be notably higher than the throughput achieved during separate output of complete pages.

While example embodiments including various combinations and configurations of system controllers, read interfaces, I/O interfaces, arrays, memory devices, device controllers, page buffers, CR buffers, ECC engines, and architecture of the same, among other components for performance of continuous read operations, have been illustrated and described herein, embodiments of the present disclosure are not limited to those combinations explicitly recited herein. Other combinations and configurations of the system controllers, read interfaces, I/O interfaces, arrays, memory devices, device controllers, page buffers, CR buffers, ECC engines, and architecture of the same, among other components for performance of the continuous read operations disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    a memory device, comprising:
        an array of memory cells configured to store a plurality of pages of data;
        a page buffer coupled to the array and configured to store a page of data of the array, wherein the page buffer includes:
            a primary cache coupled to the array and configured to store the page of data; and
            a secondary cache coupled to the primary cache and configured to receive, from the primary cache, the page of data of the array; and
        a continuous read buffer coupled to the secondary cache and including:
            a first cache configured to receive a first segment of the page of data from the secondary cache and;
            a second cache configured to receive a second segment of the page of data from the secondary cache,
    wherein the memory device is configured to perform a continuous read operation on the first and second segments from the first cache and the second cache of the continuous read buffer.

2. The apparatus of claim 1, wherein:
    the first cache is configured to store the first segment of the page of data;
    the second cache is configured to store the second segment of the page of data; and
    the first and second segments are contiguous segments of the page of data.

3. The apparatus of claim 1, wherein the first cache and the second cache are configured to receive the first segment and the second segment independently and sequentially.

4. The apparatus of claim 1, wherein the first cache and the second cache are configured to during the continuous read operation, interleave output of the first segment to an input/output (I/O) line with at least a portion of the second segment being received by the second cache.

5. The apparatus of claim 1, wherein:
    the secondary cache is selectably coupled to the continuous read buffer; and
    the continuous read buffer is selectably coupled to an input/output (I/O) line.

6. The apparatus of claim 1, wherein:
    the secondary cache is configured to selectably transfer segments of the page of data to the continuous read buffer; and
    the continuous read buffer is selectably coupled, via an input/output (I/O) line, to an output interface to transfer the segments of the page of data during the continuous read operation.

7. The apparatus of claim 1, further comprising a host coupled to the memory device and configured to:
    send instructions to initiate the continuous read operation; and
    address a particular address of one of the plurality of pages of data stored by the array; and
    wherein the memory device further includes a device controller configured to:
    receive the instructions from the host; and
    responsive to the instructions:
        initiate the continuous read operation; access the one of the plurality of pages of data associated with the particular address; and
        transfer the first segment of the one of the plurality of pages of data stored at the particular address to the first cache.

8. The apparatus of claim 7, wherein the device controller is configured to initiate initiation of the continuous read operation by being configured to direct:
    storage of the one of the plurality of pages of data by the page buffer; and
    transfer of a segment of the one of the plurality of pages of data to the first cache.

9. The apparatus of claim 1, wherein the memory device further includes a device controller configured to, in response to instructions from a system controller coupled to the memory device, direct:
    performance of the continuous read operation starting with the first segment stored by the first cache; and
    transfer of the first segment from the first cache to an input/output (I/O) line followed by transfer of the second segment from the second cache to the I/O line.

10. The apparatus of claim 1, wherein the continuous read buffer is configured to:

receive the first segment, via the first cache, during a first clock phase;

transfer, during a second clock phase, the first segment from the first cache to an input/output (I/O) line;

receive the second segment, via the second cache, during the second clock phase; and transfer, during a third clock phase, the second segment from the second cache to the I/O line.

11. The apparatus of claim 1, further comprising:
a system controller, on a host coupled to the memory device, including a read interface configured to send a plurality of read commands to the memory device, wherein:
the read commands include:
a first command to read the page of data for storage by the page buffer; and
a second command to continuously read a plurality of pages of data sequentially stored by the continuous read buffer, the plurality of pages of data corresponding to a plurality of segments each of the plurality of pages of data; and
the continuous read buffer is configured to transfer the plurality of segments alternately from the first cache and the second cache of the continuous read buffer to an input/output (I/O) line.

12. The apparatus of claim 11, wherein the read commands further include a third command, sent between the first command and the second command, to transfer the plurality of segments from the page buffer to the continuous read buffer sequentially.

13. A system, comprising:
a memory device, comprising:
an array of memory cells configured to store a plurality of pages of data;
a primary cache selectably coupled to the array and configured to store one of the plurality of pages of data;
a secondary cache coupled to the primary cache and configured to store one of the plurality of pages of data, received from the primary cache;
a continuous read buffer selectively coupled to the secondary cache and including a first cache and a second cache; and
an error correction code (ECC) engine selectably coupled to the continuous read buffer; and
a host coupled to the memory device and configured to direct a continuous read operation performed on a plurality of segments of the plurality of pages of data, wherein:
the first cache is configured to store a first segment of the plurality of segments; and
the second cache is configured to store a second segment of the plurality of segments.

14. The system of claim 13, wherein the memory device further comprises a device controller configured to direct:
transfer of the first segment, followed by the second segment, from the secondary cache to the ECC engine;
selective coupling of the continuous read buffer to the ECC engine; and
transfer of the first segment, followed by the second segment, from the ECC engine to the first cache, and
wherein the first segment and the second segment each include, prior to movement of the first and second segments to the respective first and second caches, data for error detection and correction by the ECC engine.

15. The system of claim 13, wherein the memory device further comprises a device controller configured to direct:

selective coupling of the continuous read buffer to the secondary cache;
transfer of the first segment from the secondary cache to the first cache and the second segment from the secondary cache to the second cache; and
transfer of the first segment from the first cache to the ECC engine followed by transfer of the second segment from the second cache to the ECC engine, and
wherein the first segment and the second segment each include data for error detection and correction by the ECC engine prior to a write back of corrected data values for the first and second segments to the respective first and second caches.

16. The system of claim 13, wherein the memory device further comprises a device controller configured to direct:
coupling of the continuous read buffer and the ECC engine to the secondary cache at substantially the same time;
transfer of the first segment from the secondary cache to the first cache and the ECC engine at substantially a same first time point; and
transfer of the second segment from the secondary cache to the first cache and the ECC engine at substantially a same second time point, and
wherein the first segment and the second segment each include data for error detection and correction by the ECC engine prior to a write back of corrected data values for the first and second segments to the respective first and second caches.

17. The system of claim 13, wherein the memory device further comprises a clock configured to provide clock phases to enable synchronized timing of read sub-operation performance, wherein:
the ECC engine and the continuous read buffer are synchronized such that:
the first segment is transferred, during a first clock phase of the clock, from the ECC engine to the first cache;
the first segment is transferred, during a second clock phase of the clock, from the first cache to an input/output (I/O) line coupled to an output interface of the memory device;
the second segment is transferred, during the second clock phase, from the ECC engine to the second cache; and
the second segment is transferred, during a third clock phase of the clock, from the second cache to the I/O line coupled to the output interface; and
the output interface is configured to transfer the plurality of segments of data values of each of the plurality of pages of data to the host during consecutive clock phases of the clock.

18. The system of claim 13, wherein a quantity of the plurality of data values of each segment corresponds to a quantity of data values on which the ECC engine is configured to perform error detection and correction during one clock phase prior to correction of data values of the first or second segment stored by the continuous read buffer.

19. The system of claim 13, wherein a quantity of the plurality of segments of a page of data stored by the array corresponds to a quantity of memory cells associated with the page of data divided by a quantity of data values on which the ECC engine is configured to perform error detection and correction during one clock phase prior to correction of data values of the first or second segment stored by the continuous read buffer.

20. The system of claim 13, wherein the memory device further comprises read circuitry configured to selectively couple the primary cache to the array.

21. The system of claim 13, wherein:
the primary cache, the secondary cache, and the first cache and the second cache of the continuous read buffer are each independent random access memory (RAM) devices;
a data storage capacity of the primary cache and the secondary cache corresponds to a quantity of data values of a page of data stored by the array; and
a data storage capacity of the first cache and the second cache corresponds to a quantity of a plurality of data values in a segment of the page of data.

22. The system of claim 13, wherein the array is a NAND flash memory.

23. The system of claim 13, wherein the host further comprises a system controller including a read interface configured to send, to the memory device, a plurality of read commands to direct performance of the continuous read operation, and
wherein the read commands include:
a first command to start the continuous read operation at a first particular address of one of the plurality of pages of data stored by the array and continue the continuous read operation through a last page of data stored by the array; and
a second command to stop the continuous read operation at a second particular address of a page of data stored by the array prior to the last page of data stored by the array.

24. The system of claim 13, wherein the host further comprises a system controller including a read interface configured to send, to the memory device, a plurality of read commands to direct performance of a read operation, and
wherein the read commands include:
a first command to transfer the page of data from the secondary cache to an input/output (I/O) line; and
a second command to continuously read the plurality of pages of data, corresponding to the plurality of segments of each of the plurality of pages of data, stored by the first and second caches, and transfer each of the plurality of segments alternately from the first cache and the second cache to the I/O line.

25. A method for operating a memory device, comprising:
performing a continuous read operation on the memory device comprising an array of memory cells configured to store a plurality of pages of data, a primary cache, a secondary cache, and a continuous read buffer including a first cache and a second cache,
wherein the continuous read operation comprises:
accessing a first page of data stored by the array;
transferring the first page of data to the primary cache;
transferring the first page of data to the secondary cache;
receiving, by the first cache, a first segment of the first page of data from the secondary cache;
concurrent with receipt of the first segment by the first cache from the secondary cache, transferring a second page of data stored by the array to the primary cache;
transferring the first segment from the first cache to an input/output (I/O) line; and
during transfer of the first segment from the first cache, interleaving receipt of a second segment of the first page of data by the second cache.

26. The method of claim 25, wherein performing of the continuous read operation further comprises:
performing the continuous read operation on sequential segments, accessed from the first page of data; and
transferring the sequential segments alternately from the first cache coupled to the I/O line and the second cache coupled to the I/O line.

27. The method of claim 25, wherein performing of the continuous read operation further comprises:
receiving a third segment of data, corresponding to a last segment accessed from the first page of data, by the first cache;
transferring the third segment from the first cache to the I/O line; and
concurrent with transferring the third segment from the first cache, interleaving receipt of a fourth segment of data, corresponding to a first segment of the second page of data, by the second cache.

28. The method of claim 25, wherein performing of the continuous read operation further comprises:
performing the continuous read operation on sequential segments of the first and second pages of data;
transferring the sequential segments alternately from the first cache coupled to the I/O line and the second cache coupled to the I/O line; and
transferring a last segment of the first page of data via the I/O line followed sequentially and continuously with transfer of a first segment of the second page of data via the I/O line.

* * * * *